(12) United States Patent
Chern et al.

(10) Patent No.: US 9,887,189 B2
(45) Date of Patent: Feb. 6, 2018

(54) INTEGRATED CIRCUITS WITH RESISTORS

(71) Applicant: TAIWAN SEMICONDUCTOR MANUFACTURING COMPANY, LTD., Hsinchu (TW)

(72) Inventors: Chan-Hong Chern, Palo Alto, CA (US); Fu-Lung Hsueh, Cranbury, NJ (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/887,877

(22) Filed: Oct. 20, 2015

(65) Prior Publication Data

US 2016/0043071 A1 Feb. 11, 2016

Related U.S. Application Data

(60) Continuation of application No. 14/475,058, filed on Sep. 2, 2014, now Pat. No. 9,171,839, which is a division of application No. 13/035,533, filed on Feb. 25, 2011, now Pat. No. 8,835,246.

(51) Int. Cl.
| | |
|---|---|
| *H01L 27/06* | (2006.01) |
| *H01L 49/02* | (2006.01) |
| *H01L 29/49* | (2006.01) |
| *H01L 27/12* | (2006.01) |
| *H01L 29/423* | (2006.01) |

(52) U.S. Cl.
CPC ...... *H01L 27/0629* (2013.01); *H01L 27/1207* (2013.01); *H01L 28/20* (2013.01); *H01L 29/42364* (2013.01); *H01L 29/42372* (2013.01); *H01L 29/4958* (2013.01); *H01L 29/4966* (2013.01); *H01L 29/4975* (2013.01)

(58) Field of Classification Search
CPC . H01L 27/0629; H01L 27/1207; H01L 28/20; H01L 29/42364; H01L 29/42372; H01L 29/4966; H01L 29/4975; H01L 29/4958
See application file for complete search history.

(56) References Cited

U.S. PATENT DOCUMENTS

| | | | |
|---|---|---|---|
| 6,406,956 B1 * | 6/2002 | Tsai | H01L 27/0629 257/E21.004 |
| 7,785,979 B2 * | 8/2010 | Booth, Jr. | H01L 27/0629 257/E21.004 |
| 8,058,125 B1 | 11/2011 | Lin et al. | |
| 8,193,900 B2 | 6/2012 | Fan et al. | |
| 8,361,848 B2 | 1/2013 | Lee et al. | |
| 8,637,936 B2 | 1/2014 | Chiu et al. | |
| 8,742,513 B2 | 6/2014 | Wei et al. | |
| 8,890,260 B2 * | 11/2014 | Chuang | H01L 21/823842 257/379 |

(Continued)

*Primary Examiner* — Allan R Wilson
(74) *Attorney, Agent, or Firm* — Hauptman Ham, LLP

(57) ABSTRACT

An integrated circuit includes transistor and resistor. The transistor includes a gate stack. The gate stack includes a first dielectric layer, a first conductive layer over the first dielectric layer, a second conductive layer over the first conductive layer, and a second dielectric layer over the second conductive layer. The transistor also includes source/drain (S/D) regions adjacent to the gate stack. The resistor adjacent to the transistor, and includes a third dielectric layer.

20 Claims, 27 Drawing Sheets

(56) References Cited

U.S. PATENT DOCUMENTS

| | | |
|---|---|---|
| 9,165,997 B2 * | 10/2015 | Chen .................... H01L 27/0629 |
| 2006/0208338 A1 | 9/2006 | Lee et al. |
| 2008/0194072 A1 | 8/2008 | Yu et al. |
| 2009/0020828 A1 | 1/2009 | Yamada |
| 2009/0236669 A1 | 9/2009 | Chen et al. |
| 2009/0242997 A1 * | 10/2009 | Yu ........................... H01L 27/11 |
| | | 257/379 |
| 2010/0013026 A1 | 1/2010 | Booth et al. |
| 2010/0289080 A1 | 11/2010 | Wei et al. |
| 2010/0320544 A1 | 12/2010 | Tseng et al. |
| 2010/0328022 A1 | 12/2010 | Fan et al. |
| 2011/0057267 A1 * | 3/2011 | Chuang ........... H01L 21/823842 |
| | | 257/380 |
| 2011/0073957 A1 | 3/2011 | Chiu et al. |
| 2011/0117710 A1 | 5/2011 | Lin et al. |
| 2011/0147853 A1 * | 6/2011 | Lin ................. H01L 21/823807 |
| | | 257/379 |
| 2011/0266637 A1 | 11/2011 | Lee et al. |
| 2012/0214284 A1 | 8/2012 | Fan et al. |
| 2013/0049168 A1 | 2/2013 | Yang et al. |
| 2013/0126979 A1 | 5/2013 | Chern et al. |
| 2013/0200466 A1 | 8/2013 | Zhao et al. |
| 2015/0132902 A1 * | 5/2015 | Chuang ............. H01L 29/66545 |
| | | 438/210 |

* cited by examiner

US 9,887,189 B2

1

INTEGRATED CIRCUITS WITH RESISTORS

PRIORITY CLAIM

The present application is a continuation of U.S. application Ser. No. 14/475,058, filed Sep. 2, 2014, which is a divisional of U.S. application Ser. No. 13/035,533, filed Feb. 25, 2011, which are incorporated herein by reference in their entireties.

TECHNICAL FIELD

The present disclosure relates generally to the field of semiconductor devices, and more particularly, to integrated circuits with resistors.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. Metal-oxide semiconductor (MOS) transistors have typically been formed with silicon gate electrodes. There has been a desire to fabricate these devices with a metal material for the gate electrode and a high-k dielectric for the gate dielectric.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

2

Figure 1:
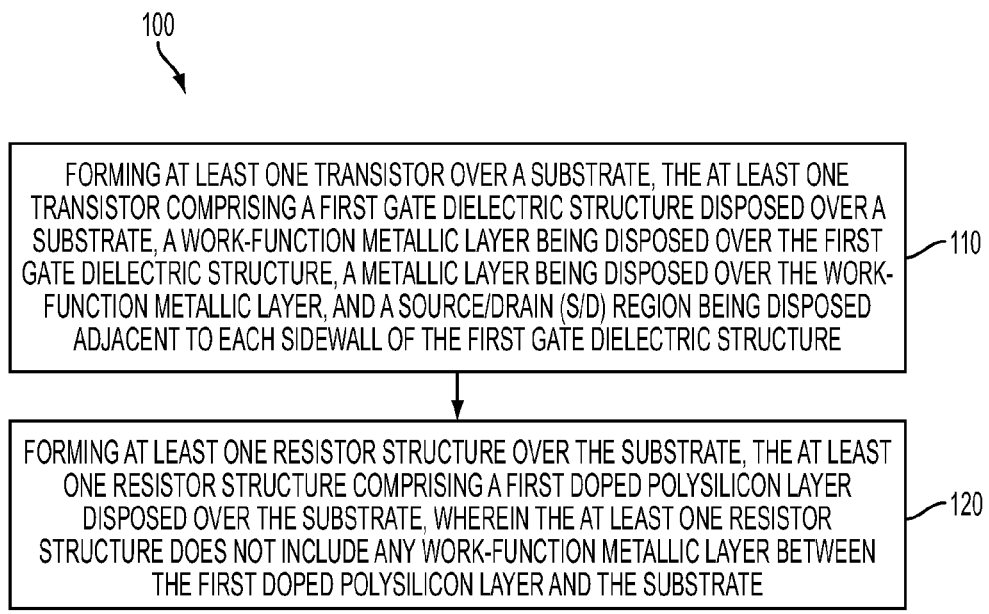
FIG. 1 is a flowchart of an exemplary method of forming an integrated circuit.

FIGS. 4A-4F are schematic cross-sectional views of an integrated circuit during various gate-first high-K metal gate fabrication stages.

DETAILED DESCRIPTION

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

Illustrated in FIG. 1 is a flowchart of an exemplary method of forming an integrated circuit. The integrated circuit may include various passive and active microelectronic devices, such as resistors, capacitors, inductors, diodes, metal-oxide-semiconductor field effect transistors (MOSFET), complementary MOS (CMOS) transistors, bipolar junction transistors (BJTs), laterally diffused MOS (LDMOS) transistors, high power MOS transistors, FinFET transistors, or other types of transistors. In some embodiments, the integrated circuit can include a mixed-signal circuit, a radio frequency (RF) circuit, other high-speed circuits, or any combinations thereof.

Referring now to FIG. 1, the method 100 of forming an integrated circuit can include forming at least one transistor over a substrate (block 110). The at least one transistor includes a first gate dielectric structure disposed over a substrate. A work-function metallic layer is disposed over the first gate dielectric structure. A metallic layer is disposed over the work-function metallic layer. A source/drain (S/D) region is disposed adjacent to each sidewall of the first gate dielectric structure. The method 100 also includes forming at least one resistor structure over the substrate (block 120). The at least one resistor structure includes a first doped silicon layer disposed over the substrate. The at least one resistor structure does not include any work-function metallic layer between the first doped silicon layer and the substrate.

In some embodiments, the method 100 can include forming a second gate dielectric structure between the substrate and the first doped silicon layer. The second gate dielectric structure directly contacts the first doped silicon layer. In other embodiments, the method 100 can include forming a silicide region disposed over the first doped silicon layer. In still other embodiments, the work-function metallic layer continuously extends along sidewalls of the conductive layer. In yet still other embodiments, the work-function metallic layer has a length which is substantially equal to that of the first gate dielectric structure. In still other embodiments, the method 100 can include forming a second doped silicon layer disposed over the conductive layer.

It is understood that FIG. 1 has been simplified for a better understanding of the concepts of the present disclosure. Accordingly, it should be noted that additional processes may be provided before, during, and after the method 100 of FIG. 1, and that some other processes may only be briefly described herein. It is also noted that though FIG. 1 shows the order of the blocks 110 and 120, the order shown in FIG. 1 is merely exemplary. In some embodiments, at least one process step can be shared for forming portions of the transistor and the resistor structure.

FIGS. 2A-2K are schematic cross-sectional views of an integrated circuit during various gate-last high-K metal gate fabrication stages. It is understood that FIGS. 2A-2K have been simplified for a better understanding of the concepts of the present disclosure. Accordingly, it should be noted that additional processes may be provided before, during, and after FIGS. 2A-2K, and that some other processes may only be briefly described herein.

Referring now to FIGS. 2A-2K, an integrated circuit 200 can be fabricated over a substrate 201. The integrated circuit 200 can include a transistor region 213 and a resistor region 215. The substrate 201 can be a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

Figure 2A:
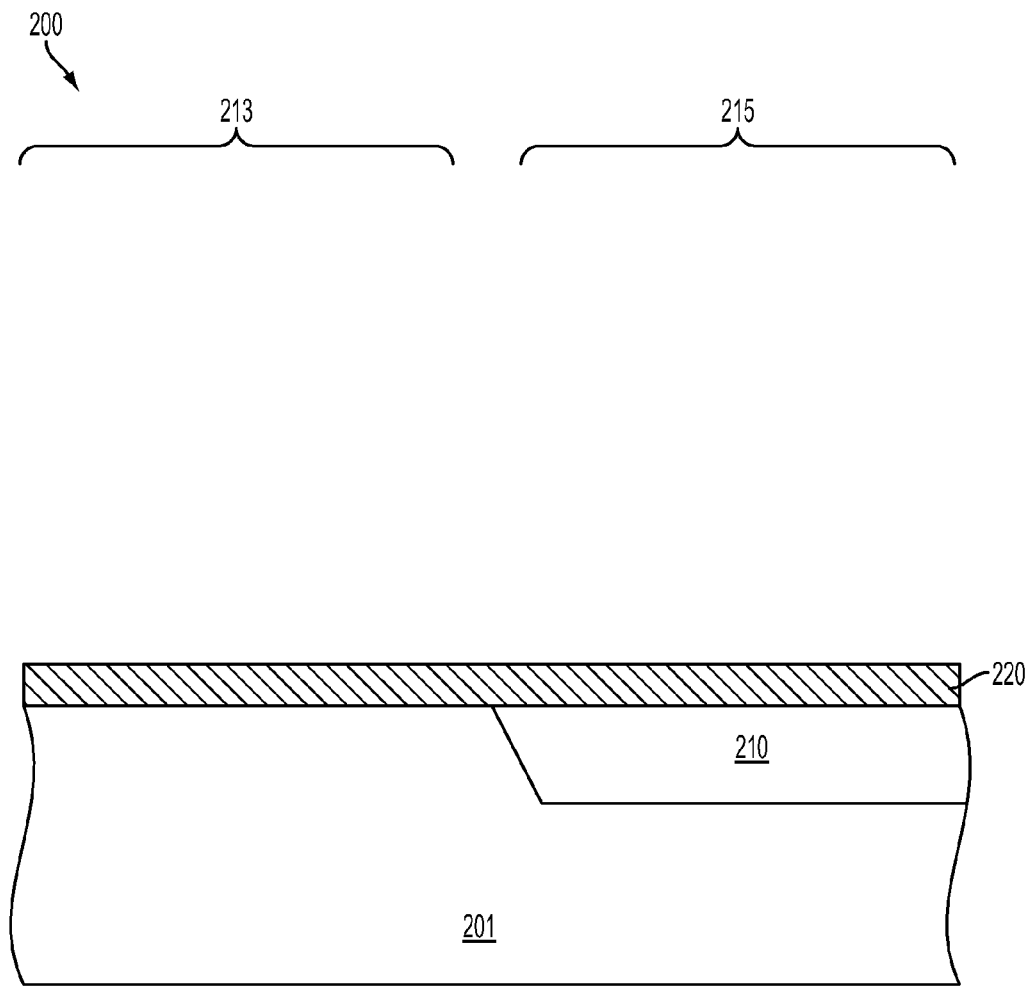
FIGS. 2A-2K are schematic cross-sectional views of an integrated circuit during various gate-last high-K metal gate fabrication stages.

Referring to FIG. 2A, an isolation structure, e.g., a shallow trench isolation (STI) feature 210, can be formed in the substrate 201. In some embodiments, the STI feature 210 can be formed by etching recesses (or trenches) in the substrate 201 and filling the recesses with a dielectric material. In some embodiments, the dielectric material of the STI feature 210 can include silicon oxide. In alternative embodiments, the dielectric material of the STI feature 210 may include silicon nitride, silicon oxynitride, fluoride-doped silicate (FSG), and/or a low-k dielectric material.

Referring again to FIG. 2A, a gate dielectric stack 220 can be formed over the substrate 201. In some embodiments, the gate dielectric stack 220 can include at least one interfacial dielectric layer and/or at least one high dielectric constant (high-k) layer. The interfacial dielectric layer may include a material such as silicon oxide, silicon nitride, silicon oxynitride, other gate dielectric materials, and/or combinations thereof. The high-k dielectric layer can have a material having a dielectric constant that is greater than a dielectric constant of $SiO_2$, which is approximately 4. The high-k gate dielectric layer can have a thickness that is greater than the interfacial dielectric layer. In some embodiments, the high-k gate dielectric layer may include at least one of $Al_2O_3$, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, or any combinations thereof. In some embodiments, the interfacial dielectric layer and/or the high-k gate dielectric layer can be formed by, for example, a chemical vapor deposition (CVD) process, an atomic layer deposition (ALD) process, a thermal oxidation process, a furnace process, other deposition processes, or any combinations thereof.

Figure 2B:
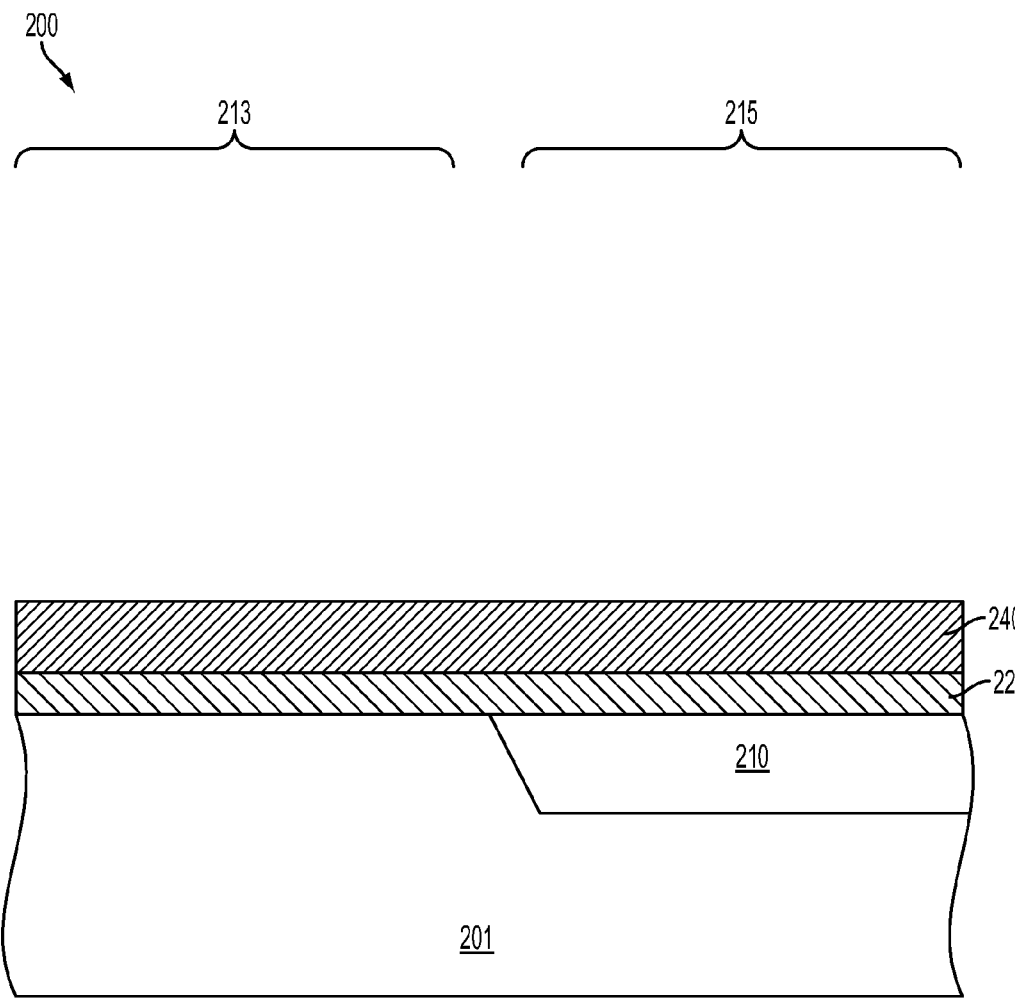

Referring to FIG. 2B, at least one work-function metallic material 240 can be formed over the gate dielectric stack 220. In some embodiments, the work-function metallic material 240 can include at least one P-type work-function metallic material and/or at least one N-type work-function metallic material. In some embodiments, the P-type work-function metallic layer can include compositions such as ruthenium, palladium, platinum, cobalt, nickel, and conductive metal oxides, and/or other suitable materials. In other embodiments, the N-type metal material can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the work-function metallic material 240 can be formed, for example, by any suitable process, such as an ALD process, CVD process, a reduced-pressure CVD (RPCVD) process, a plasma enhanced CVD (PECVD) process, a metal organic CVD (MOCVD) process, or any combinations thereof.

In some embodiments, at least one diffusion barrier (not shown) can be formed between the gate dielectric stack 220 and the work-function metallic material 240. The diffusion barrier can be configured to prevent metallic ions of the work-function metal material 240 from diffusing into the gate dielectric stack 220. The diffusion barrier may comprise at least one material such as aluminum oxide, aluminum, aluminum nitride, titanium, titanium nitride (TiN), tantalum, tantalum nitride, other suitable material, and/or combinations thereof. In some embodiments, the diffusion barrier can be formed, for example, by any suitable process, such as an ALD process, CVD process, a physical vapor deposition (PVD) process, an RPCVD process, a PECVD process, an MOCVD process, a plating process, a sputtering process, or any combinations thereof.

Figure 2C:
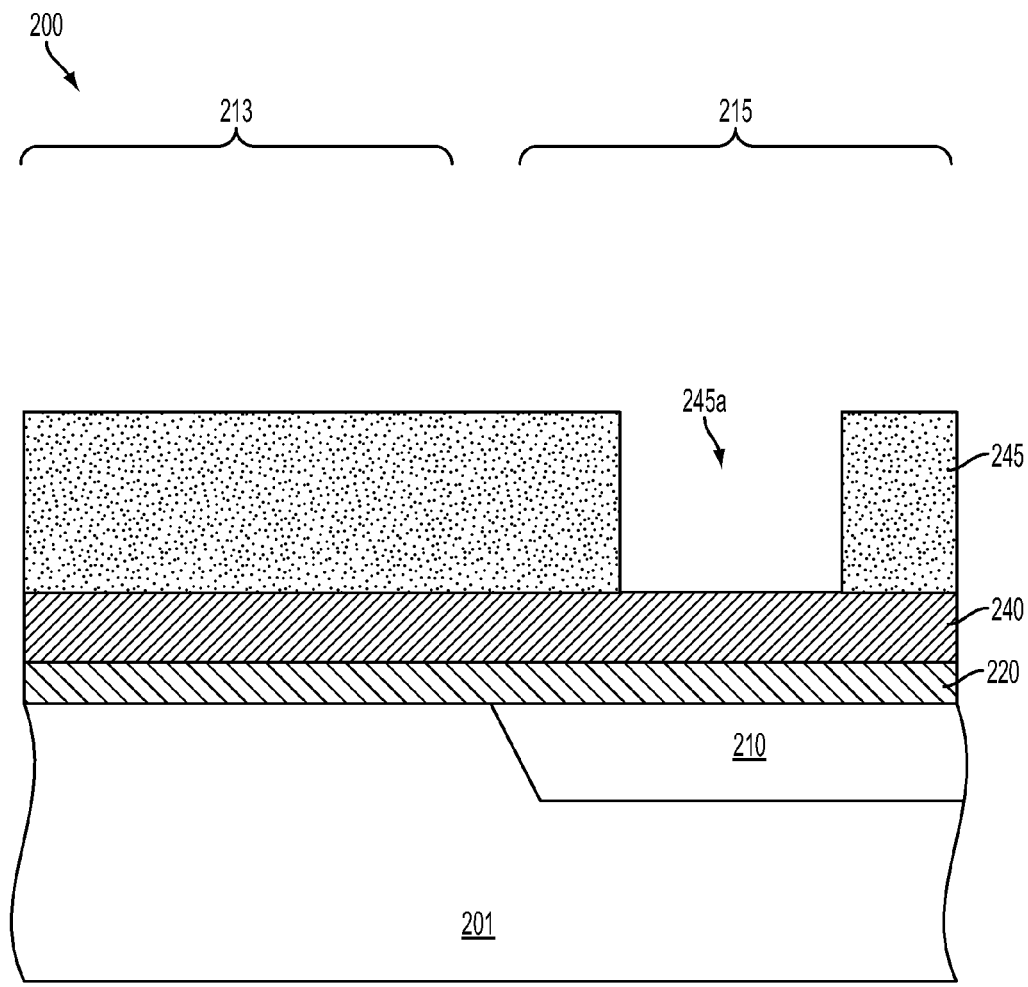

Referring to FIG. 2C, a mask layer 245 can be formed over the work-function metallic material 240. The mask layer 245 can cover the transistor region 213 and have an opening 245a exposing at least a portion of the work-function metallic material 240 in the resistor region 215. In some embodiments, the mask layer 245 can be made of, for example, a photoresist material and/or a dielectric material, e.g., silicon oxide, silicon oxynitride, silicon nitride, silicon carbide, other dielectric materials, or any combinations thereof.

Figure 2D:
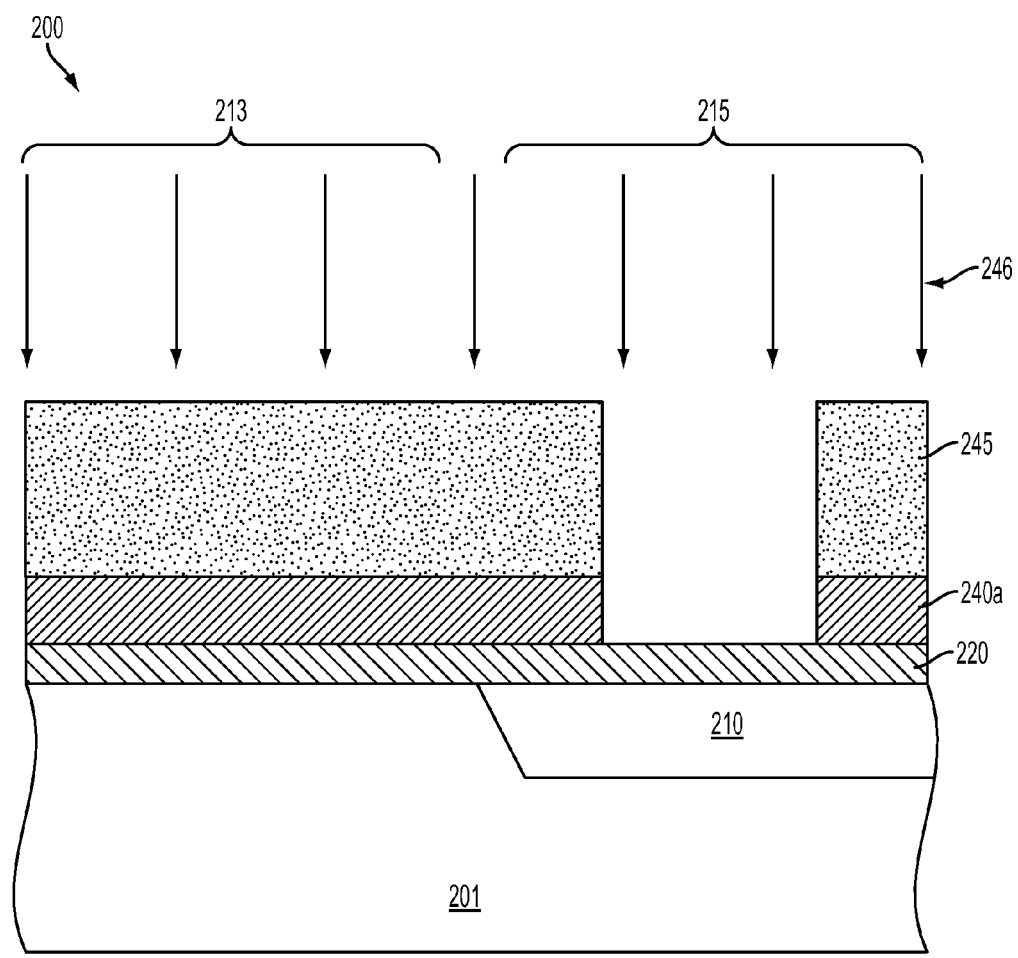
Figure 2E:
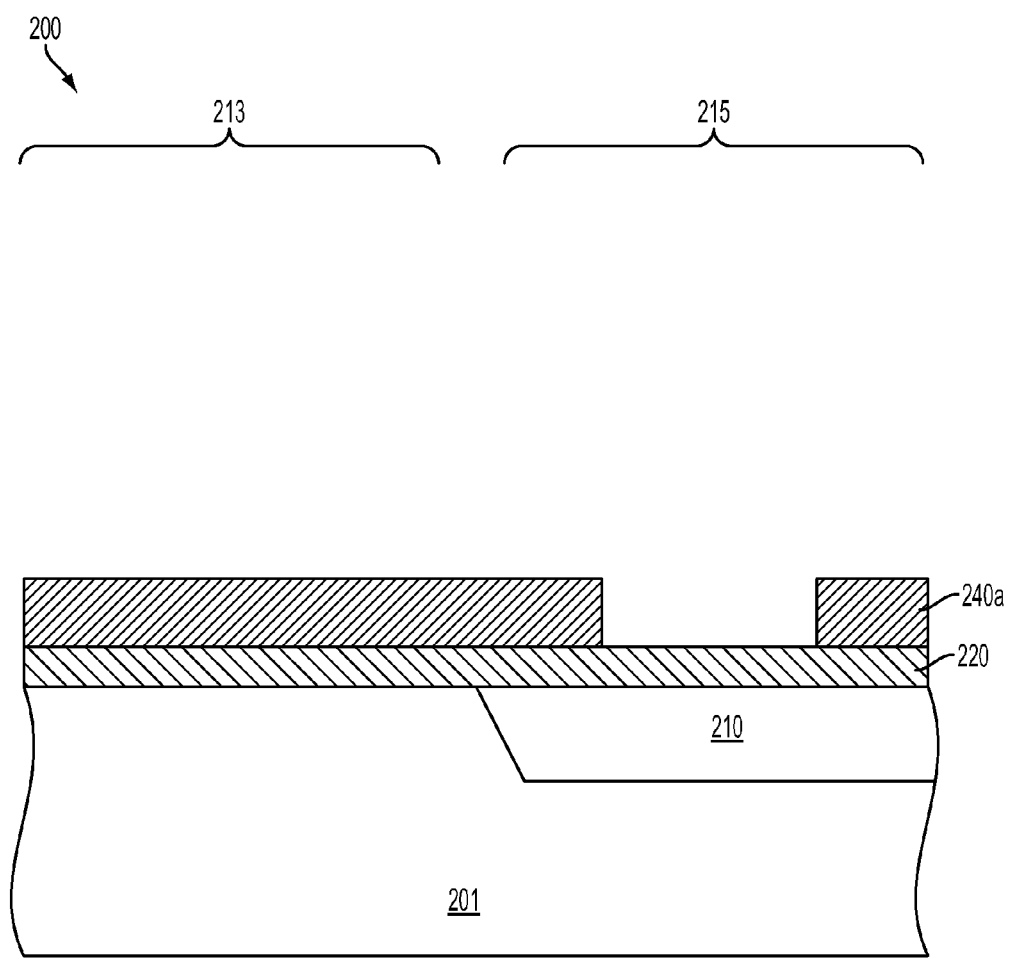

Referring to FIG. 2D, an etch process 246 uses the mask layer 245 as an etch mask to remove the exposed work-function metallic material 240 (shown in FIG. 2C), exposing a portion of the gate dielectric stack 220. The etch process 246 can include a dry etch process, a wet etch process, or any combinations thereof. After the mask layer 245 is removed, the remaining work-function metallic material 240a is exposed as shown in FIG. 2E. In some embodiments, the etch process can also remove a portion of the gate dielectric stack 220, such that a portion of the substrate 201 is exposed.

Figure 2F:
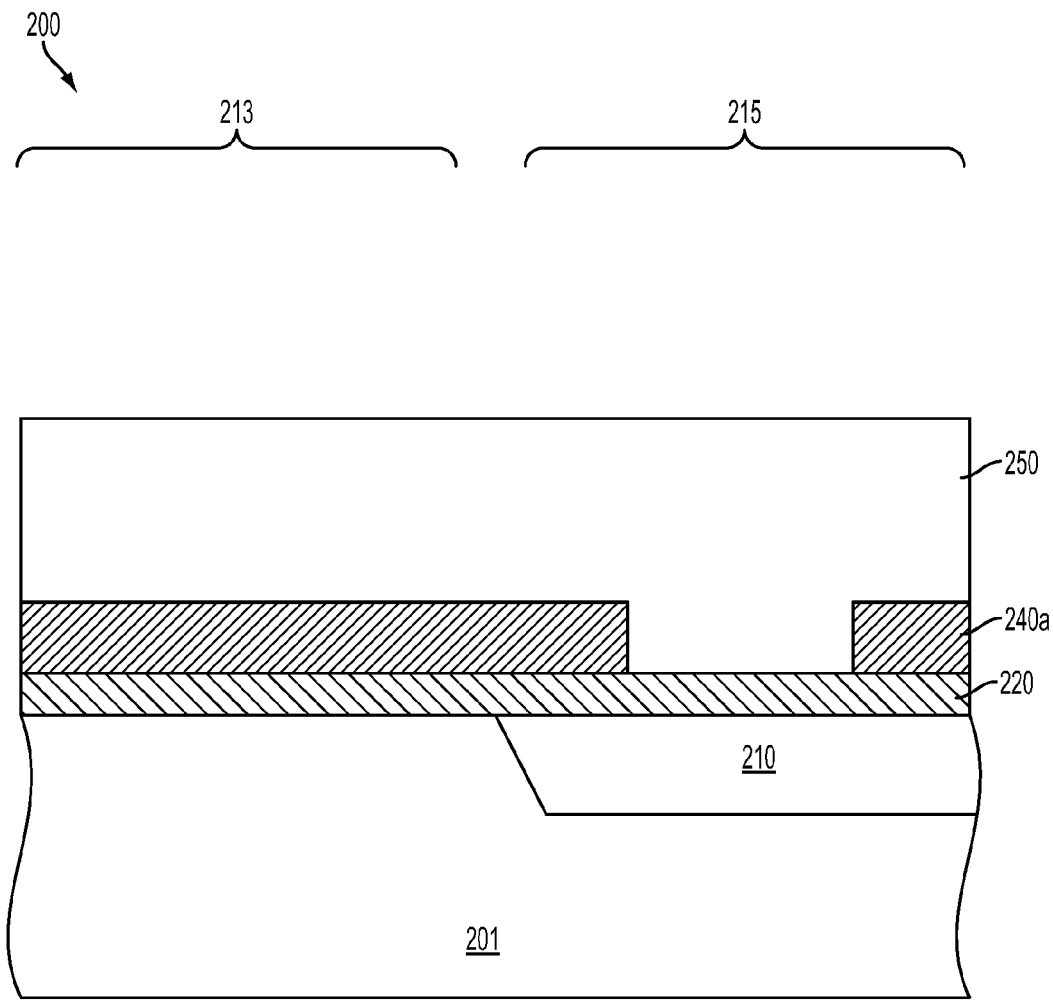

Referring to FIG. 2F, a semiconductor material 250 can be disposed over the remaining work-function metallic material 240a and the exposed portion of the gate dielectric stack 220. In some embodiments, the semiconductor material 250 can be made of, for example, silicon, amorphous silicon, crystalline silicon, or any combinations thereof. The semiconductor material 250 may be formed by chemical vapor deposition (CVD) or any suitable technique. In some embodiments, the semiconductor material 250 can be doped, e.g., in-situ doped, or undoped.

Figure 2G:
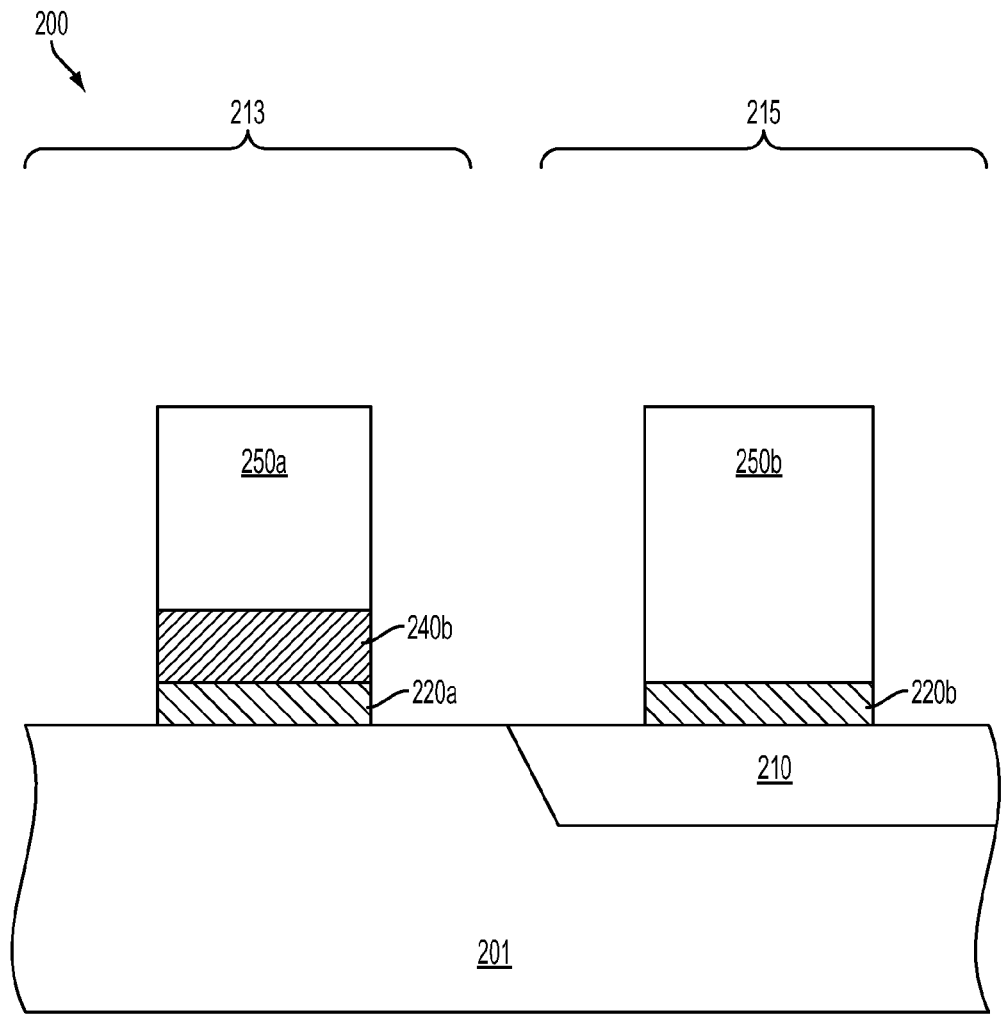

Referring to FIG. 2G, a patterning process can be performed to pattern the semiconductor material 250, the remaining work-function metallic material 240a and the gate dielectric stack 220 (shown in FIG. 2F). By the patterning process, gate dielectric structures 220a and 220b can be formed over the substrate 201, which are disposed in the transistor region 213 and the resistor region 215, respectively. A work-function metallic layer 240b can be disposed over the gate dielectric structure 220a. A semiconductor (e.g. poly-silicon) layer 250a can be disposed over the work-function metallic layer 240b. A semiconductor layer 250b can directly contact the gate dielectric structure 220b.

Figure 2H:
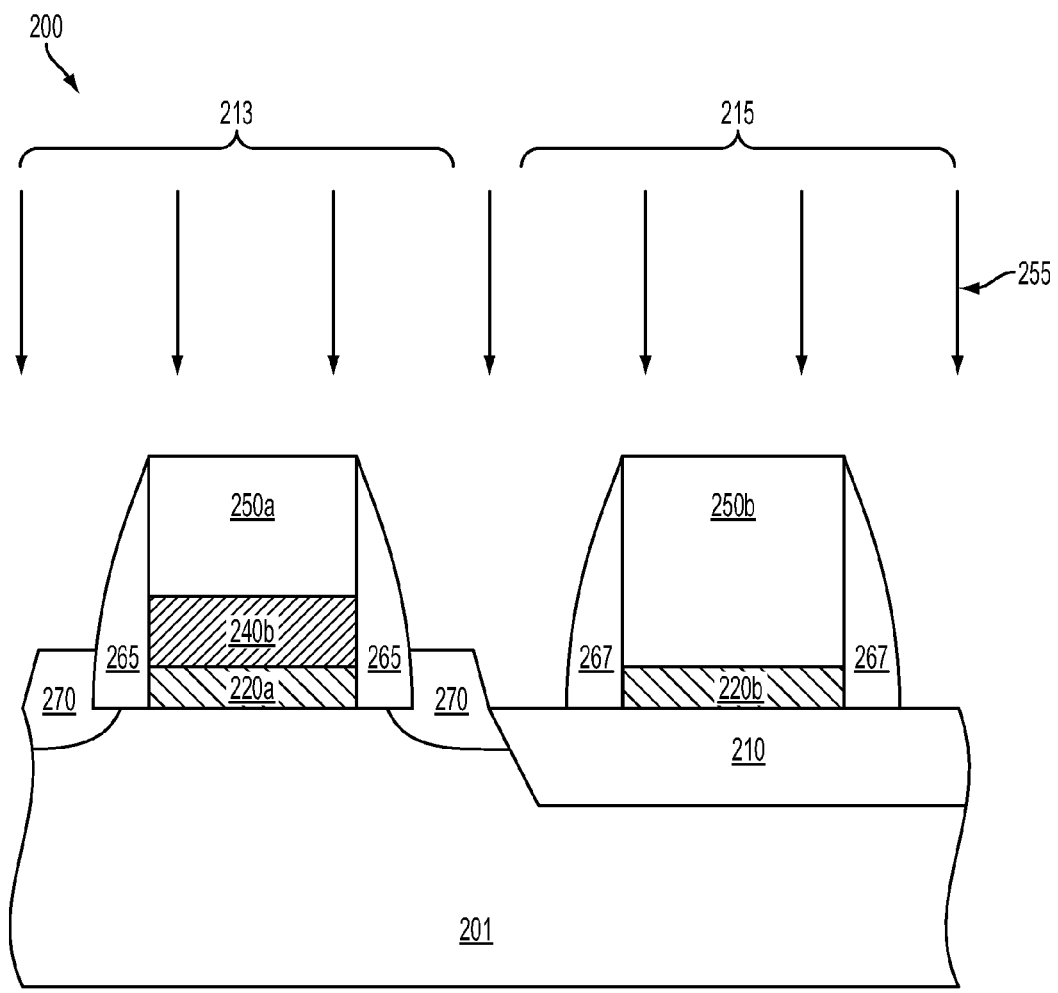

Referring to FIG. 2H, at least one implantation process 255 can be performed to implant dopants into the substrate 201 to form a source/drain (S/D) region 270 adjacent to each sidewall of the gate dielectric structure 220a. In some embodiments, the implantation process 255 can include a lightly doped drain (LDD) implantation and/or a heavy S/D implantation. In other embodiments, a thermal process and/or a rapid thermal process (RTP) can be performed to activate dopants in the S/D regions 270.

In some embodiments, the implantation process 255 can dope the S/D regions 270 as well as the semiconductor layer 250b. In other embodiments, doping the S/D regions 270 and the semiconductor layer 250b can be separated. For example, the semiconductor layer 250b can be in-situ doped as described above in conjunction with FIG. 2F. In other embodiments, the top surface of the semiconductor layer 250b can be covered by a mask layer (not shown) while the implantation process 255 is performed. Thereafter, a separate implantation process can be performed to implant dopants into the semiconductor layer 250b.

In some embodiments forming LDD regions, a lightly doped drain implantation is performed to form a LDD region (not shown) in portions of the substrate 201 adjacent to each side of the gate dielectric structure 220a. The LDD regions may be formed by an ion implantation process and/or a diffusion process. N-type dopants, such as phosphorus or arsenic, may be used to form an NMOS device, and P-type dopants, such as boron, may be used to form a PMOS device.

After the formation of the LDD regions, spacers 265 and 267 can be formed on sidewalls of the silicon layer 250a and 250b, respectively. The spacers 265 and 267 can be formed by using a deposition process and an etching process (for example, an anisotropic etching process). The spacers 265 and 267 can include a suitable dielectric material, such as silicon nitride, silicon oxide, silicon carbide, silicon oxynitride, or combinations thereof. Thereafter, the S/D regions 270 can be formed by an ion implantation process and/or a diffusion process. N-type dopants, such as phosphorus or arsenic, can be used to form an NMOS device, and P-type dopants, such as boron, can be used to form a PMOS device.

In some embodiments, the integrated circuit 200 can include at least one stressor (not shown) in each the S/D region 270. The stressor can provide a stress to a channel (not labeled) of the transistor. The stressed channel can modify a mobility of carriers therein so as to change electrical characteristics, e.g., electrical current, of the transistor. In some embodiments, the stressor in each S/D region 270 can be referred to as a raised S/D region. In some embodiments, the stressor can be formed by an epitaxial process, a reduced-pressure CVD (RPCVD) process, a molecular beam epitaxy (MBE) process, a chemical vapor deposition (CVD) process, a metal-organic chemical vapor deposition (MOCVD) process, an atomic layer deposition (ALD) process, a multi-layer epitaxial process, or any combinations thereof.

In some embodiments forming a P-type transistor, the stressor can include a single SiGe or $Si_xGe_{1-x}$ layer, a multi-layer SiGe or $Si_xGe_{1-x}$ structure, an epitaxial structure, a compound material structure, other materials that can modify the carrier mobility of the transistor, or any combinations thereof. In other embodiments forming an N-type transistor, the stressor can include a single SiC or $Si_xC_{1-x}$ layer, a multi-layer SiC or $Si_xC_{1-x}$ structure, an epitaxial structure, a compound material structure, other materials that can modify the carrier mobility of the transistor, or any combinations thereof.

In some embodiments, a silicide region (not shown) can be formed on each of the S/D regions 270, the semiconductor layers 250a and/or the semiconductor layer 250b. the silicide region may comprise at least one material such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, or any combinations thereof.

It is noted that the formation of the silicide region (not shown) on the semiconductor layer 250b can be optional. In some embodiments, the formation of the silicide region on the semiconductor layer 250b can be carried out by the process for forming the silicide regions in the S/D regions 270. In other embodiments, the silicide region is not formed on the top surface of the semiconductor layer 250b. For example, the top surface of the semiconductor layer 250b can be covered with a dielectric layer, e.g., a nitride layer, while the salicidation process is performed. By optionally forming the silicide region on the semiconductor layer 250b, the resistance of the silicon layer 250b can be adjusted.

Figure 2I:
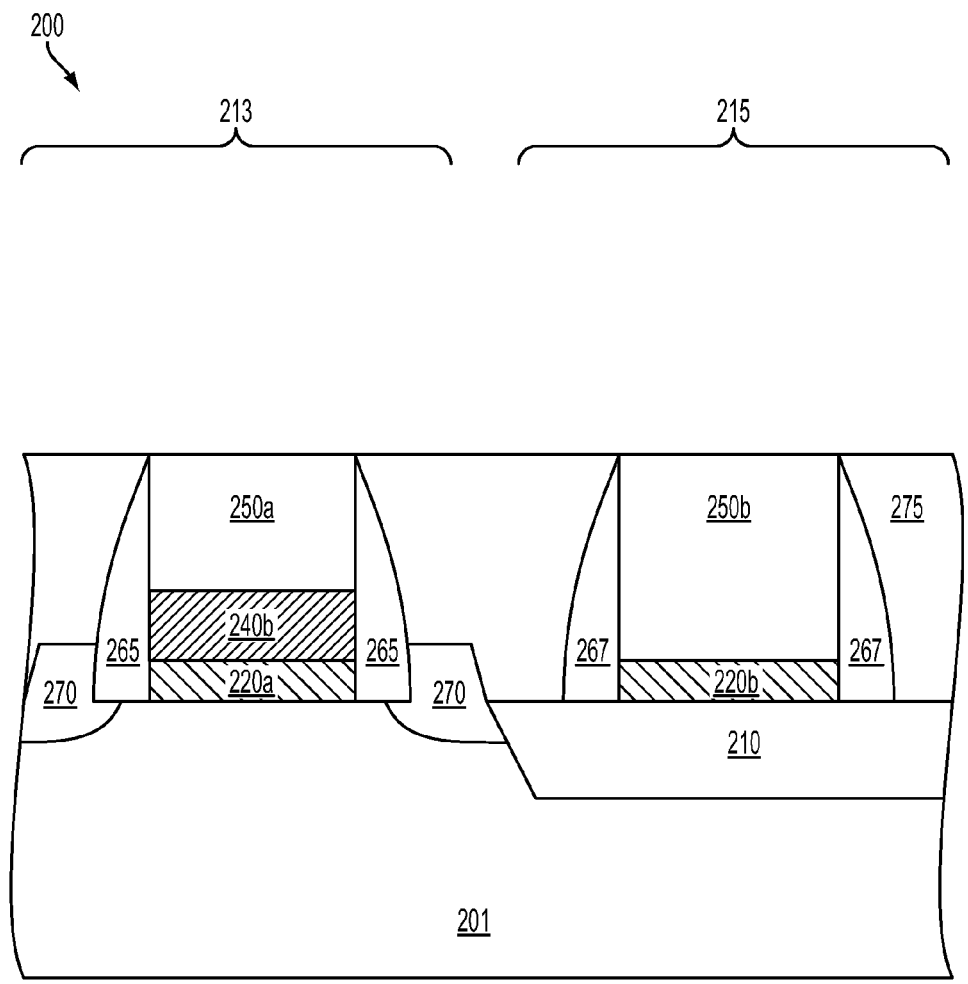

Referring to FIG. 2I, at least one dielectric layer, e.g., a dielectric layer 275, can be disposed over the substrate 201 and around the spacers 265 and 267. In some embodiments, the dielectric layer 275 can include at least one material such as phosphorous-doped silicate glass (PSG), boron-doped silicate glass (BSG), boron-phosphorous-doped silicate glass (BPSG), undoped silicate glass (USG), silicon oxide, silicon nitride, silicon oxynitride, low-k dielectric material, other dielectric materials, or combinations thereof.

In some embodiments, the top surface of the semiconductor layer 250a can be substantially leveled with the dielectric layer 275. In other embodiments, the top surface of the semiconductor layer 250a can be exposed and not covered by the dielectric layer 275.

Figure 2J:
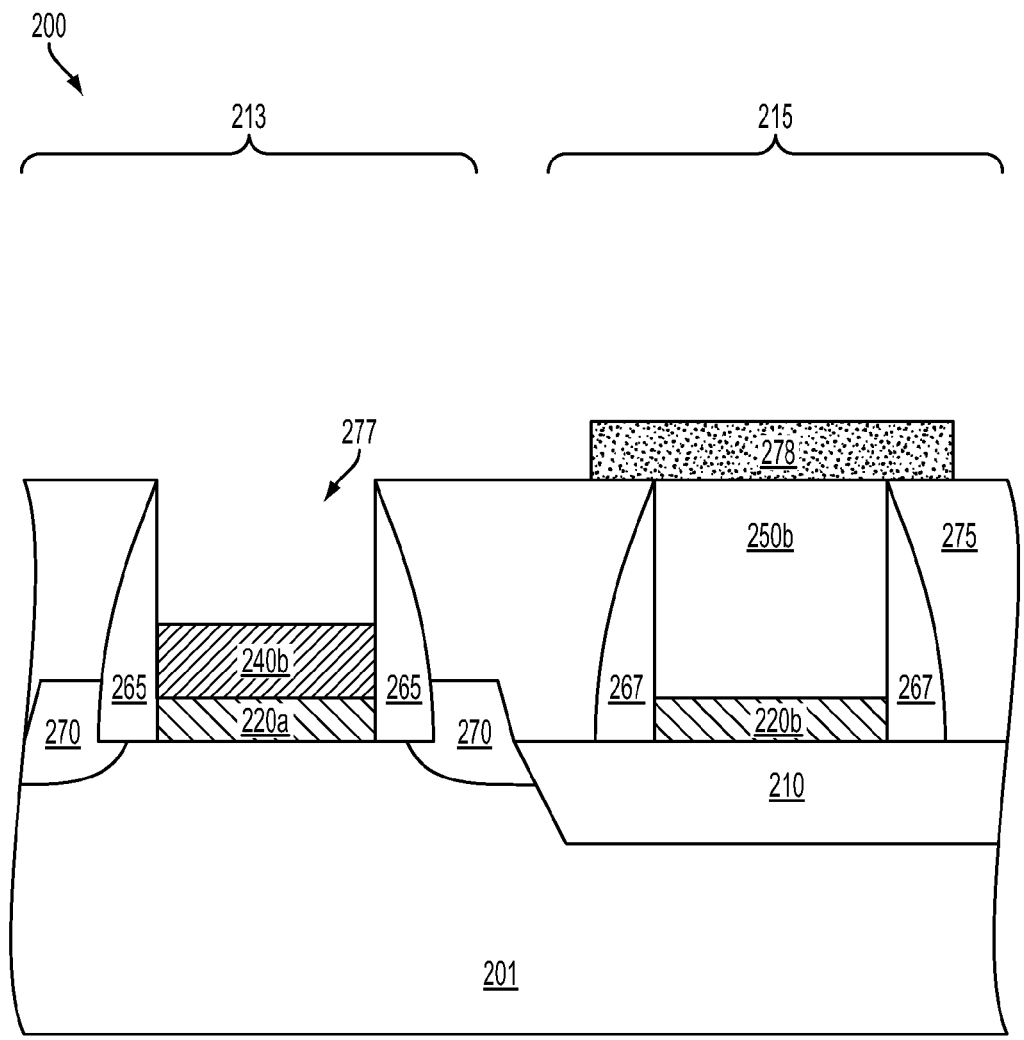

Referring to FIG. 2J, a mask layer 278, e.g., oxide, nitride, oxynitride, or any combinations thereof, can be formed, covering the top surface of the semiconductor layer 250b. The mask layer 278 can prevent the semiconductor layer 250b from being removed, while the semiconductor layer 250a (shown in FIG. 2I) is removed. After removing the semiconductor layer 250a, an opening 277 is formed. The removing process can include, for example, a wet etch process, a dry etch process, or any combinations thereof. In some embodiments, the semiconductor layer 250a can be referred to as a dummy gate that is removed during a gate-last high-k metal-gate process.

Figure 2K:
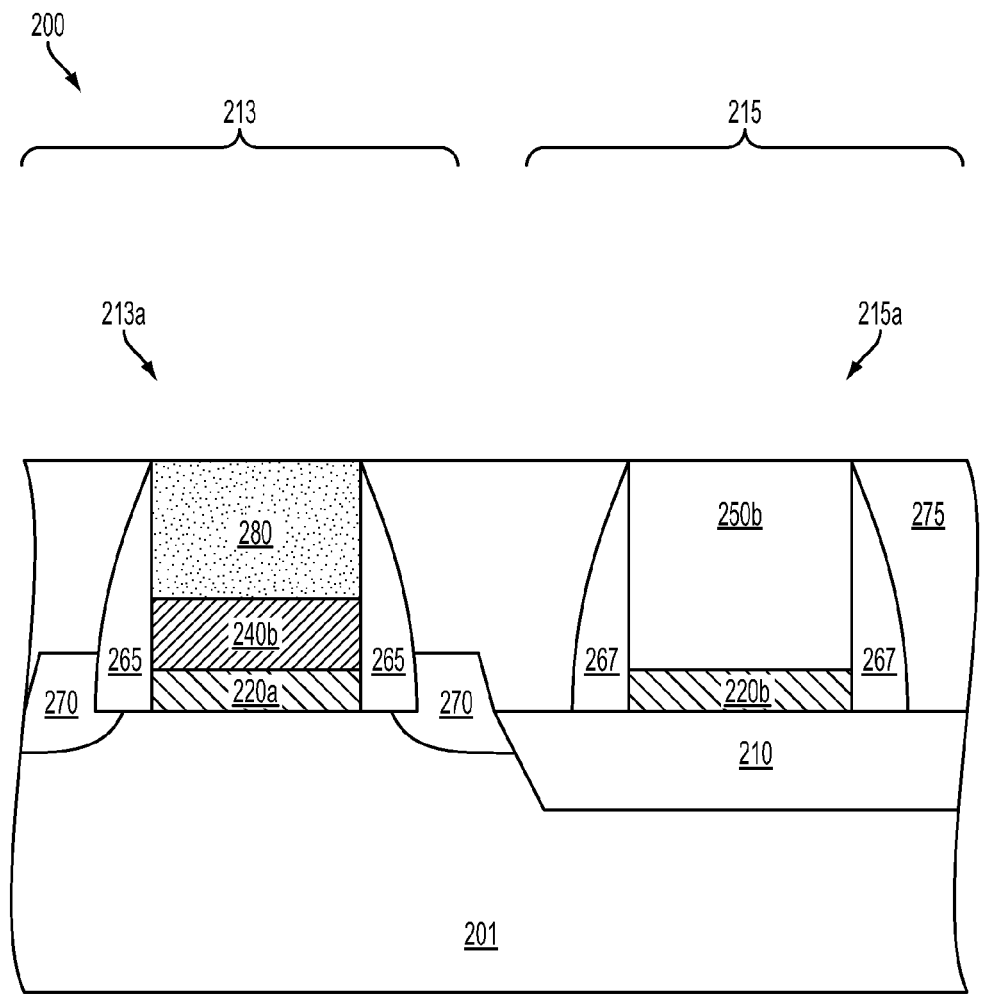

Referring to FIG. 2K, a conductive layer 280 can be formed in the opening 277 (shown in FIG. 2J). As shown, a transistor 213a and a resistor structure 215a can be formed over the substrate 201. In some embodiments, the conductive layer 280 can be made of at least one material, such as aluminum, copper, Ti, TiN, TaN, Ta, TaC, TaSiN, W, WN, MoN, MoON, $RuO_2$, and/or other suitable materials. In some embodiments, the conductive layer 280 can be formed, for example, by any suitable process, such as an ALD process, a CVD process, a physical vapor deposition (PVD) process, a reduced-pressure CVD (RPCVD) process, a PECVD process, an MOCVD process, a plating process, a sputtering process, or any combinations thereof.

Referring again to FIG. 2K, the work-function metallic layer 240b can be disposed between the conductive layer 280 and the gate dielectric structure 220a. The work-function metallic layer 240b can have a length that is substantially equal to the length of the gate dielectric structure 220a. The semiconductor layer 250b can directly contact the gate dielectric structure 220b.

In some embodiments, the integrated circuit 200 can include a mixed-signal circuit and/or a RF circuit. The transistor 213a can be a high-k/metal gate (HK/MG) transistor of the integrated circuit 200. The semiconductor layer 250b disposed in the resistor region 215 can serve as a resistor in the integrated circuit 200. A more precisely controlled resistance of the resistor in the mixed-signal and RF circuits is desired.

As noted, the resistance of the resistor can be adjusted by in-situ and/or implantation doping of the semiconductor layer 250b. Because the semiconductor layer 250b has a substantive thickness, a minor thickness variation of the semiconductor layer 250b resulting from a deposition process does not substantially affect the thickness of the semiconductor layer 250b. The resistance variation of the semiconductor layer 250b resulting from the thickness variation can be reduced. A desired resistance precision of the semiconductor layer 250b can be achieved.

It is also noted, the processes and/or structures described above in conjunction with FIGS. 2A-2K are merely exemplary. The scope of this application is not limited thereto. For example, as described in conjunction with FIG. 2D, the etch process 246 can remove portions of the work-function metallic material 240 and the gate dielectric stack 220, such that a portion of the substrate 201 is exposed. In at least this embodiment, the semiconductor layer 250b formed in FIG. 2K can directly contact the STI feature 210.

Figure 2L:
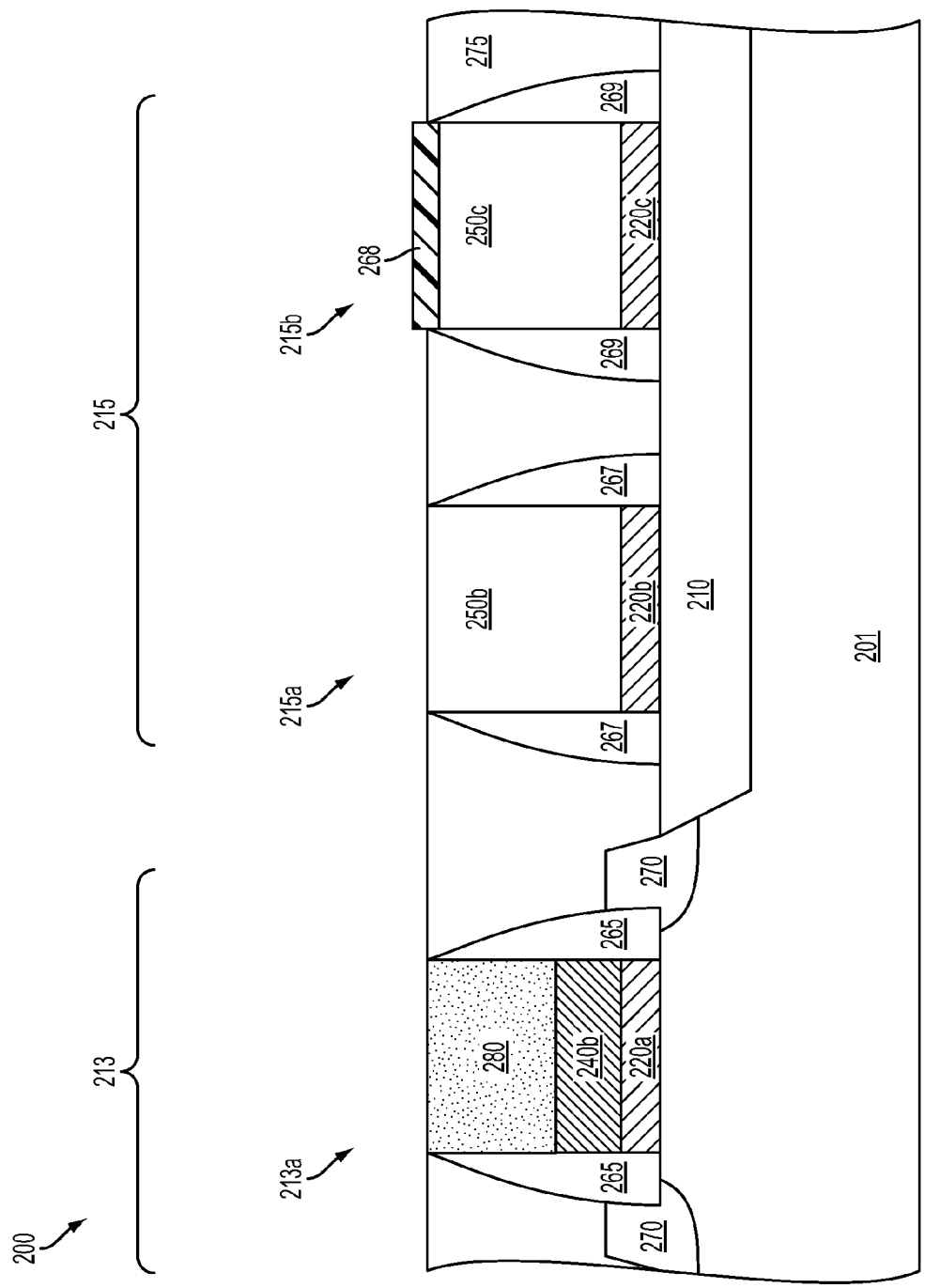
FIG. 2L is a schematic cross-sectional view of another exemplary integrated circuit.

FIG. 2L is a schematic cross-sectional view of another exemplary integrated circuit. In FIG. 2L, the resistor region 215b includes another resistor structure 215b. The resistor structure 215b can include a gate dielectric structure 220c disposed over the substrate 201. A semiconductor layer 250c can directly contact the gate dielectric structure 220c. Spacers 269 can be formed on sidewalls of the semiconductor layer 250c. A silicide region 268 can be formed on the semiconductor layer 250c. The formation of the resistor structure 215b can be carried out by the process of forming the resistor 215a described above in conjunction with FIGS. 2A-2K.

Referring again to FIG. 2L, the resistor structure 215a does not have a silicide region on the top of the semiconductor layer 250b, whereas the resistor structure 215b does have a silicide region on top of the semiconductor layer 250c. The formation of the silicide region 268 can include, for example, blocking the top surface of the semiconductor layer 250 with a dielectric layer while the salicidation process for forming the silicide regions in S/D regions 270 is performed. It is noted that because the silicide region can be optionally formed in the resistor structures 215a and 215b, the resistance of the resistor structures 215a and 215b, in series or parallel, can be adjusted.

It is understood that additional processes may be performed to complete the fabrication of the integrated circuit 200. For example, these additional processes may include forming dielectric materials, contact or via plugs, metallic regions, and/or metallic lines (not shown) over the conductive layer 280 and the semiconductor layers 250b/250c for interconnection. The dielectric layers may include materials such as silicon oxide, silicon nitride, silicon oxynitride, low-k dielectric material, ultra low-k dielectric material, or any combinations thereof. The contact/via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The contact/via plugs, metallic regions, and/or metallic lines can be formed by any suitable processes, such as deposition, photolithography, and etching processes, and/or combinations thereof. For the sake of simplicity, these additional processes are not described herein.

FIGS. 3A-3H are schematic cross-sectional views of an integrated circuit during another gate-last high-k metal-gate fabrication stages. Items of FIGS. 3A-3H that are the same or similar items in FIGS. 2A-2K are indicated by the same reference numerals, increased by 100. It is understood that FIGS. 3A-3H have been simplified for a better understanding of the concepts of the present disclosure. Accordingly, it should be noted that additional processes may be provided before, during, and after FIGS. 3A-3H, and that some other processes may only be briefly described herein.

Figure 3A:
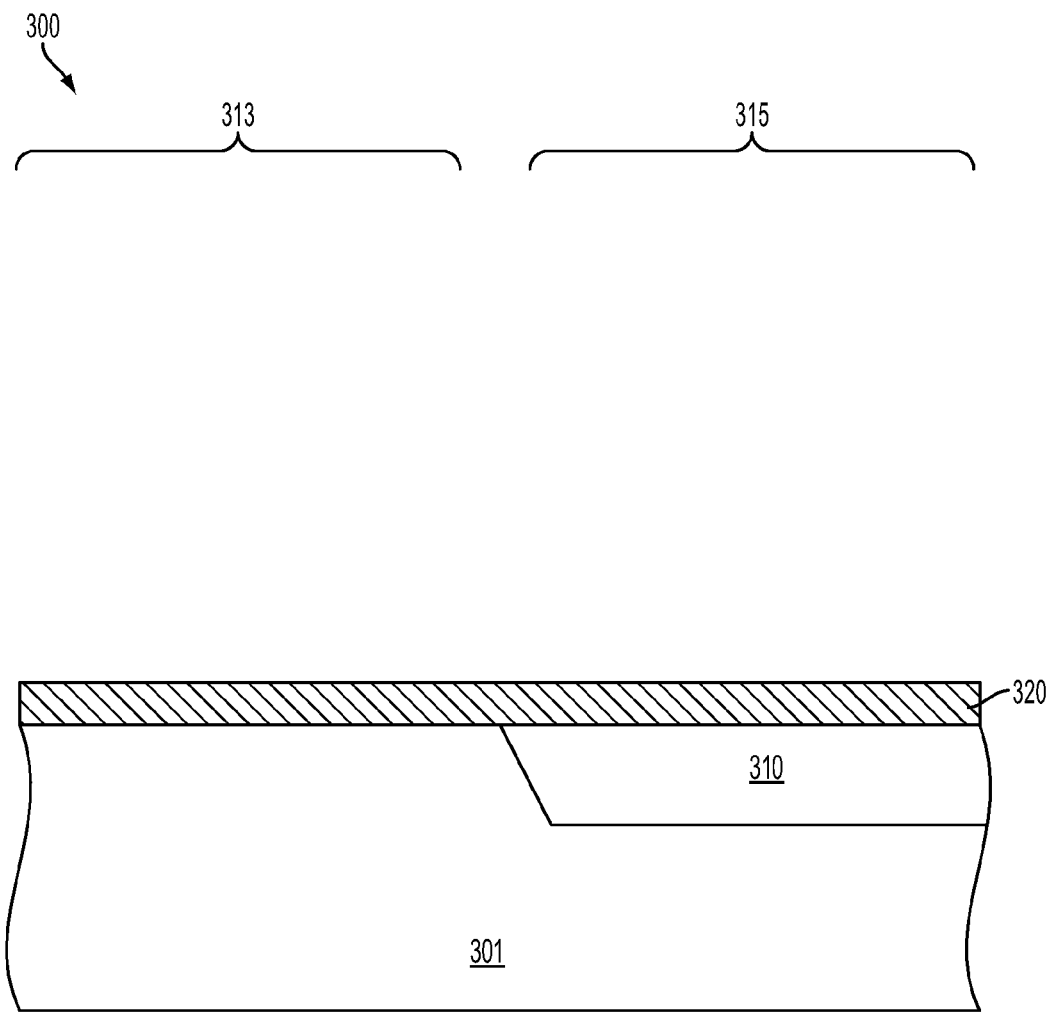
FIGS. 3A-3H are schematic cross-sectional views of an integrated circuit during other gate-last high-K metal gate fabrication stages.

Referring now to FIG. 3A, an integrated circuit 300 can be fabricated over a substrate 301. The integrated circuit 300 can include a transistor region 313 and a resistor region 315. The integrated circuit 300 can include an isolation structure, e.g., a shallow trench isolation feature 310 that can be formed in the substrate 301. A gate dielectric stack 320 can be formed over the substrate 301.

Figure 3B:
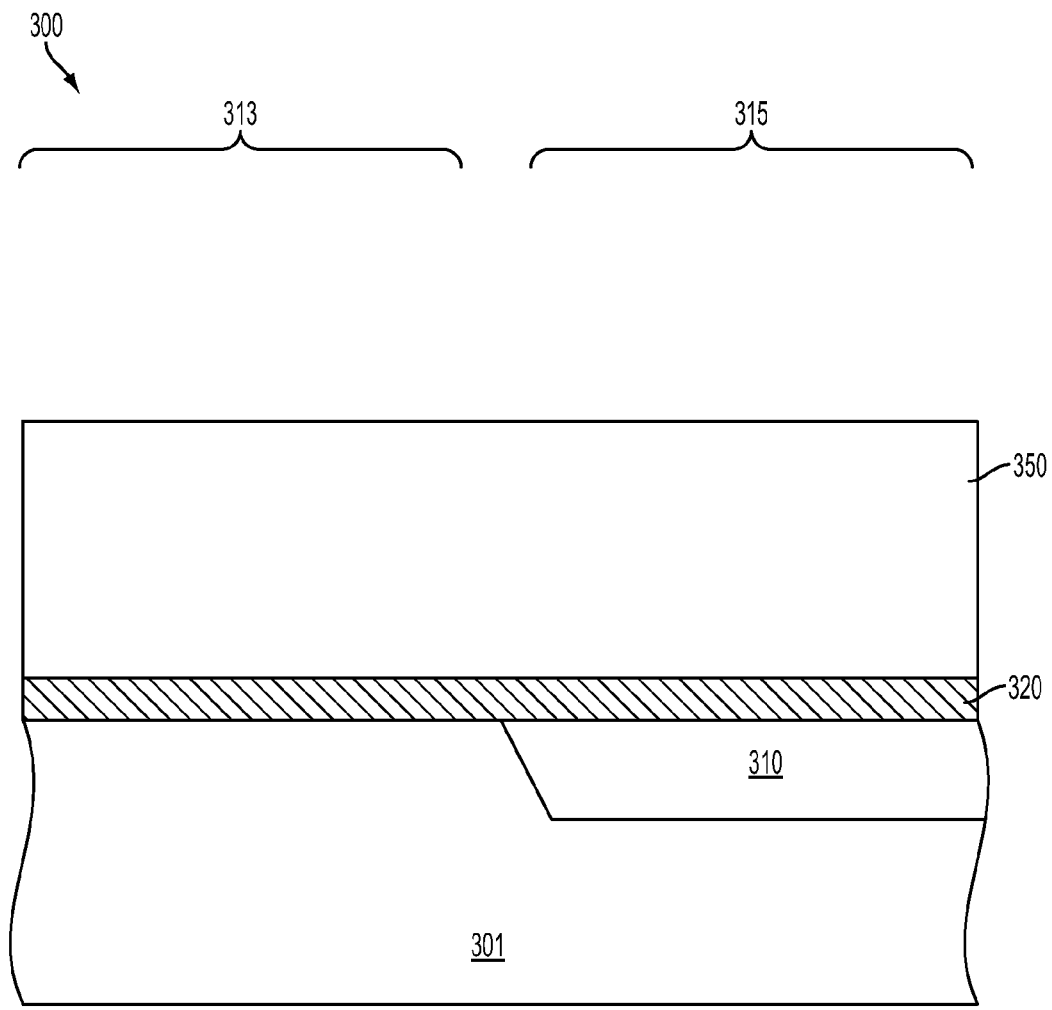

Referring to FIG. 3B, a semiconductor material 350 can be formed over the gate dielectric stack 320. In some embodiments, the semiconductor material 350 can continuously extend from the transistor region 313 to the resistor region 315. In other embodiments, the semiconductor material 350 can be undoped or in-situ doped.

Figure 3C:
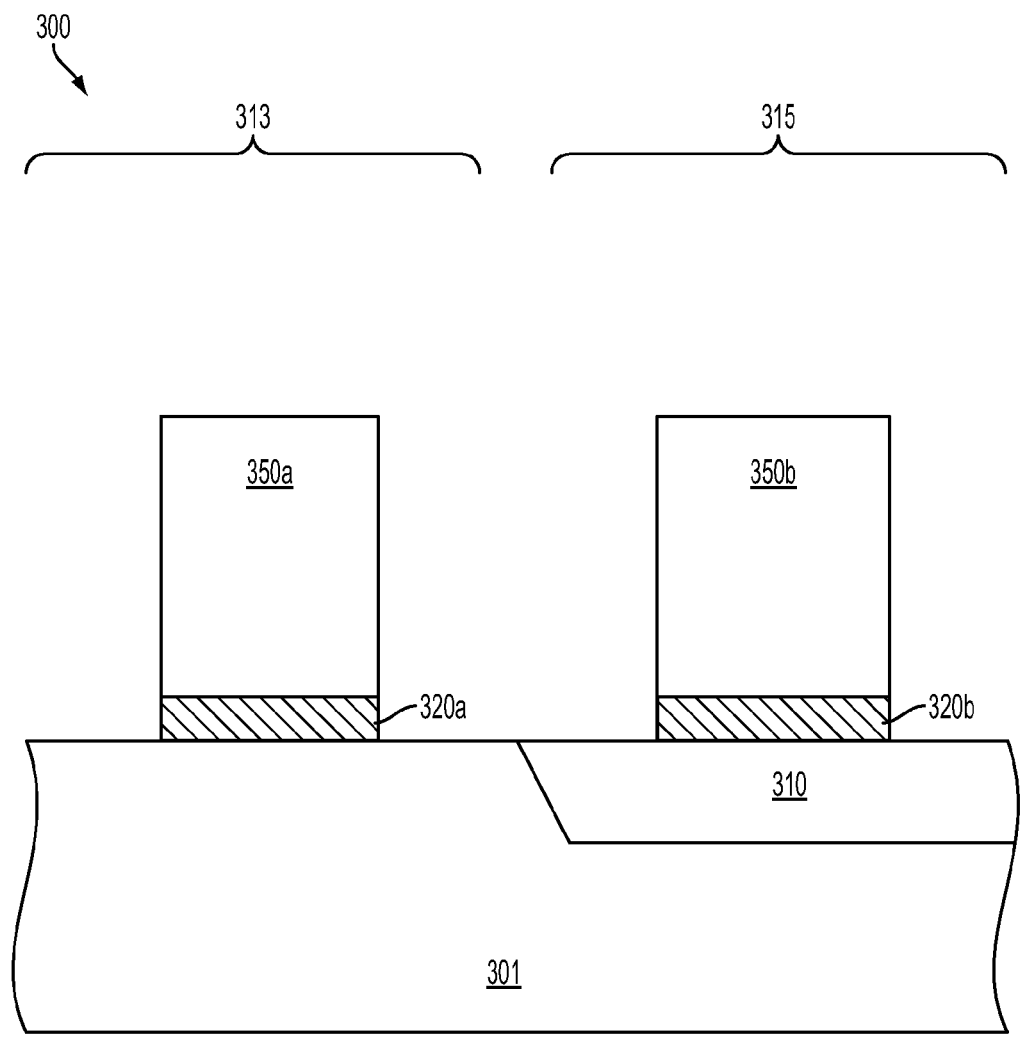

Referring to FIG. 3C, a patterning process can be performed to pattern the semiconductor material 350 and the gate dielectric stack 320 (shown in FIG. 3B). By the patterning process, gate dielectric structures 320a and 320b can be formed over the substrate 301, which are disposed in the transistor region 313 and the resistor region 315, respectively. A semiconductor layer 350a can be disposed over the gate dielectric structure 320a. A semiconductor layer 350b can directly contact the gate dielectric structure 320b.

Figure 3D:
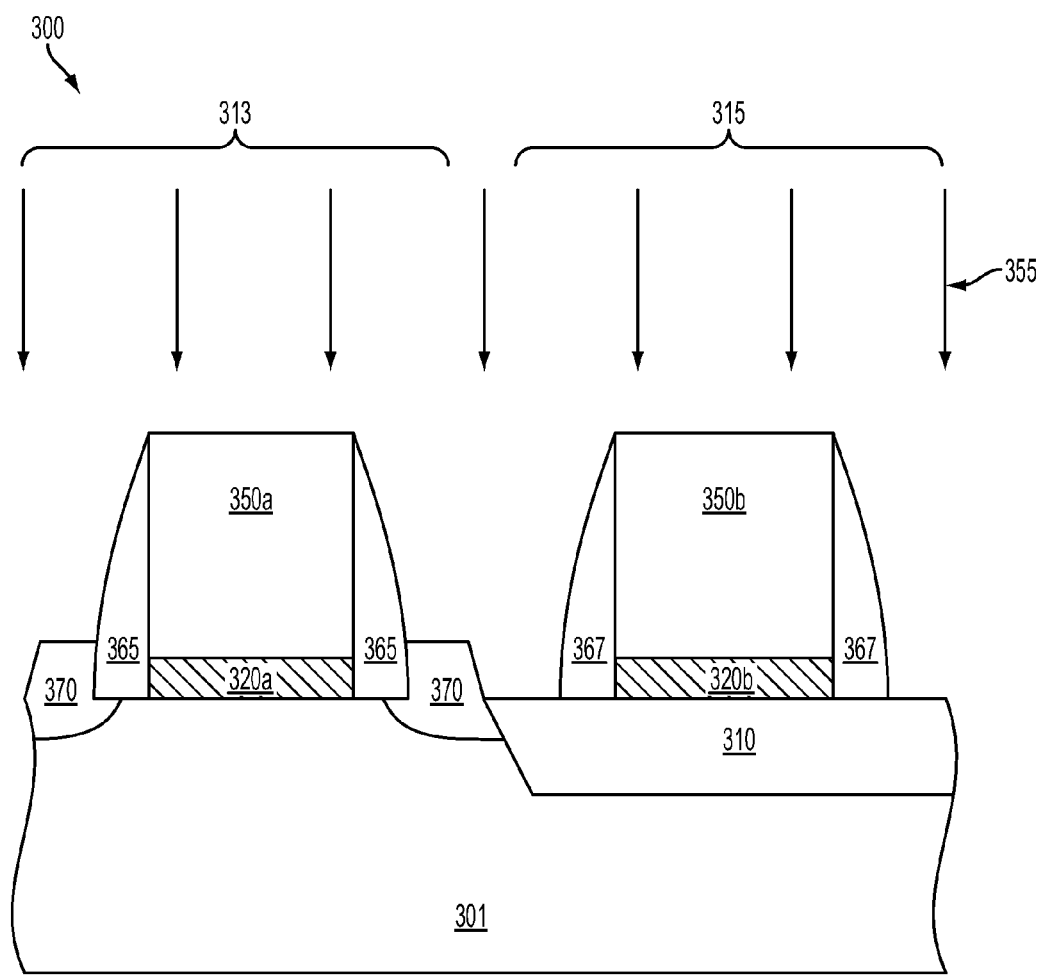

Referring to FIG. 3D, at least one implantation process 355 can be performed to implant dopants into the substrate 301 to form a source/drain (S/D) region 370 adjacent to each sidewall of the gate dielectric structure 320a. Spacers 365 and 367 can be disposed on sidewalls of the semiconductor layers 350a and 350b, respectively. It is noted that the process of forming the S/D regions 370 can optionally include the processes of forming the LDD regions, stressors and/or silicide regions described above in conjunction with FIG. 2H.

Figure 3E:
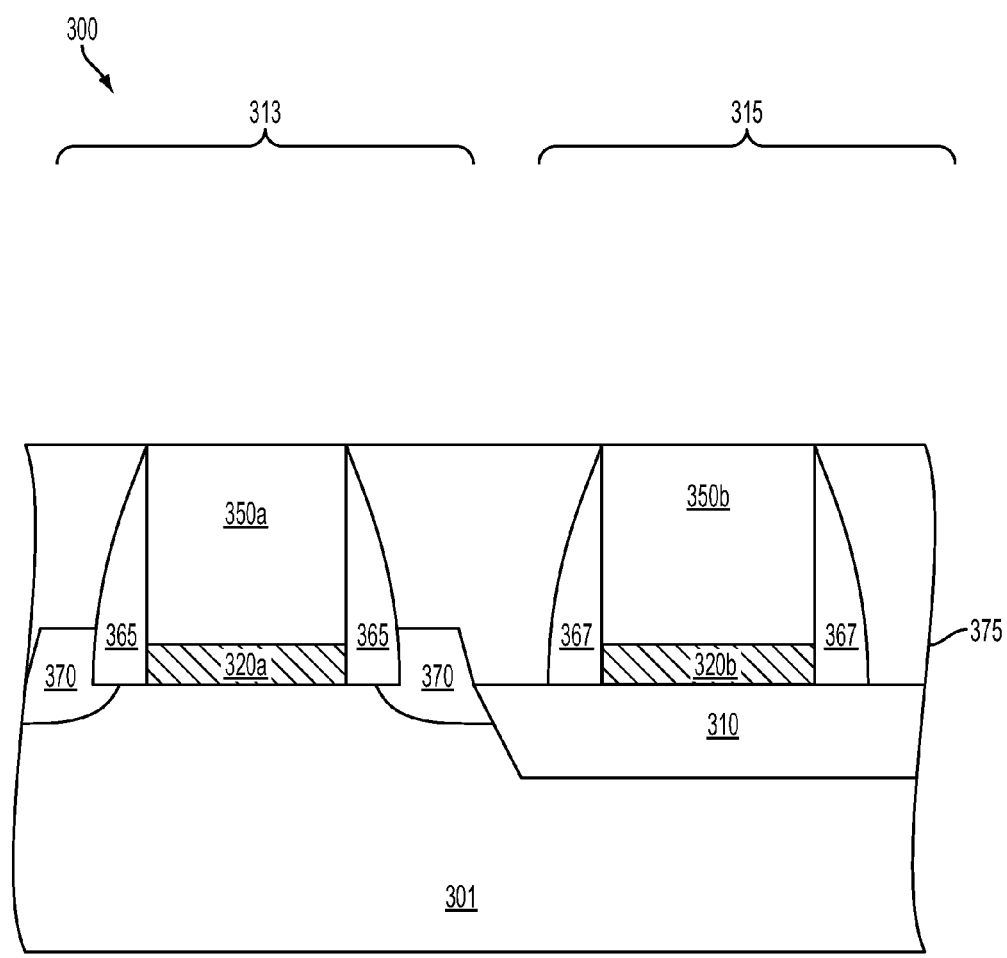

Referring to FIG. 3E, at least one dielectric layer, e.g., a dielectric layer 375, can be disposed over the substrate 301 and around the spacers 365 and 367. In some embodiments, the top surface of the semiconductor layer 350a can be substantially level with the dielectric layer 375. In other embodiments, the top surface of the semiconductor layer 350a can be exposed and not covered by the dielectric layer 375.

Figure 3F:
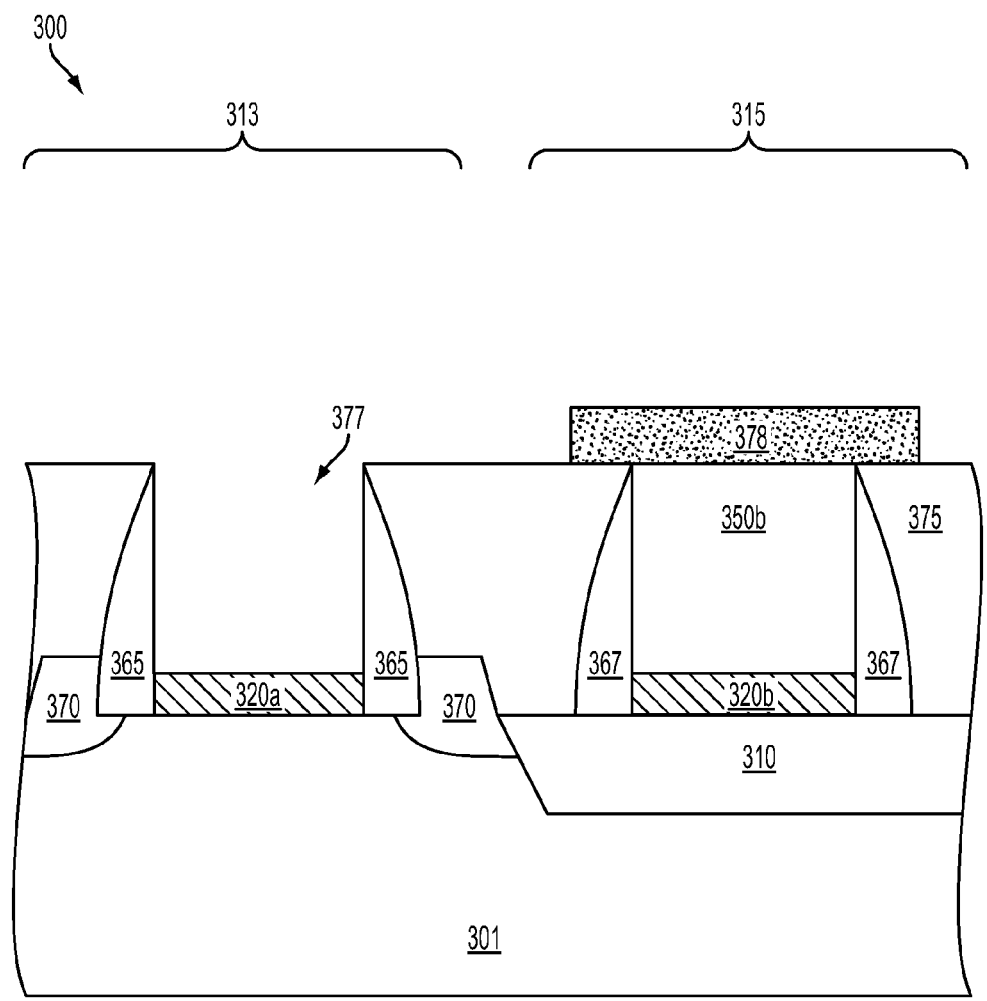

Referring to FIG. 3F, a mask layer 378, e.g., oxide, nitride, oxynitride, or any combinations thereof, can be formed, covering the top surface of the semiconductor layer 350b. The mask layer 378 can prevent the semiconductor layer 350b from being removed, while the semiconductor layer 350a (shown in FIG. 3E) is removed. After removing the semiconductor layer 350a, an opening 377 is formed. The removal process can include, for example, a wet etch process, a dry etch process, or any combinations thereof.

Figure 3G:
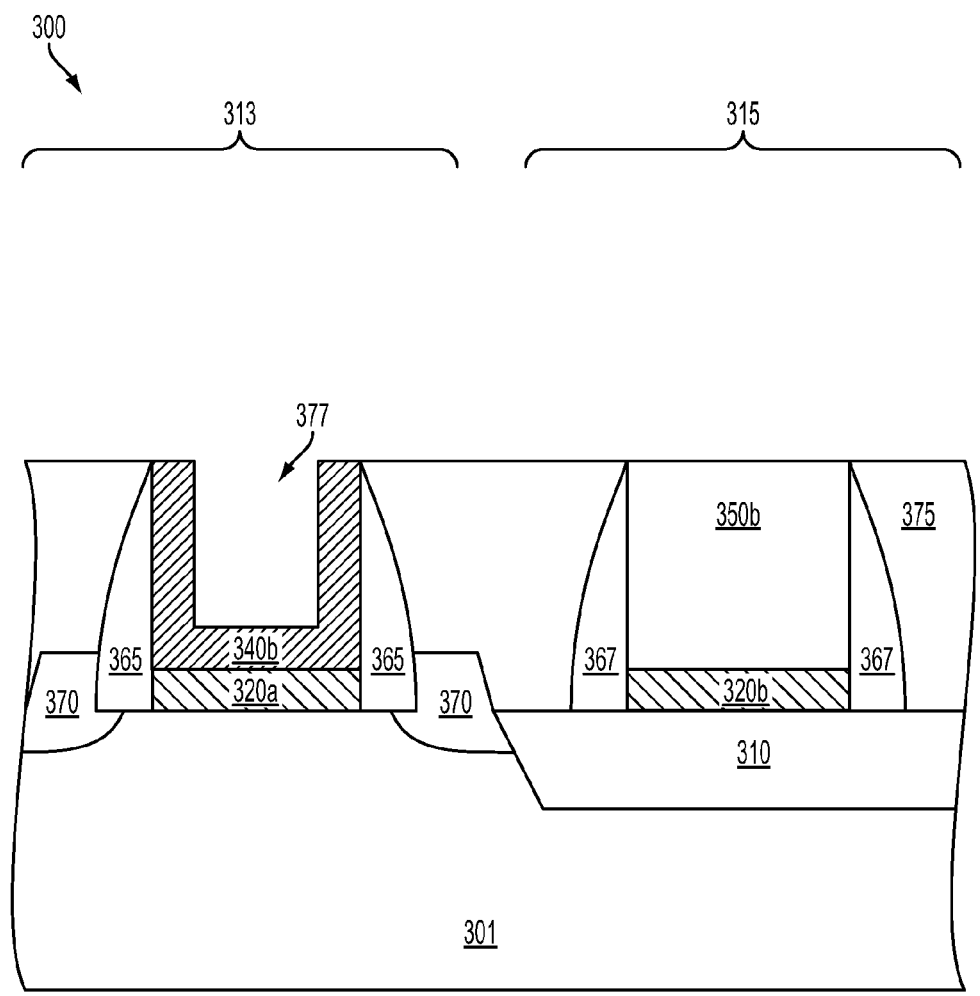

Referring to FIG. 3G, a work-function metallic layer 340b can be disposed in the opening 377 and along sidewalls of the spacers 365 and the top surface of the gate dielectric structure 320a. In some embodiments, at least one diffusion barrier (not shown) can be formed between the gate dielectric structure 320a and the work-function metallic layer 340b.

Figure 3H:
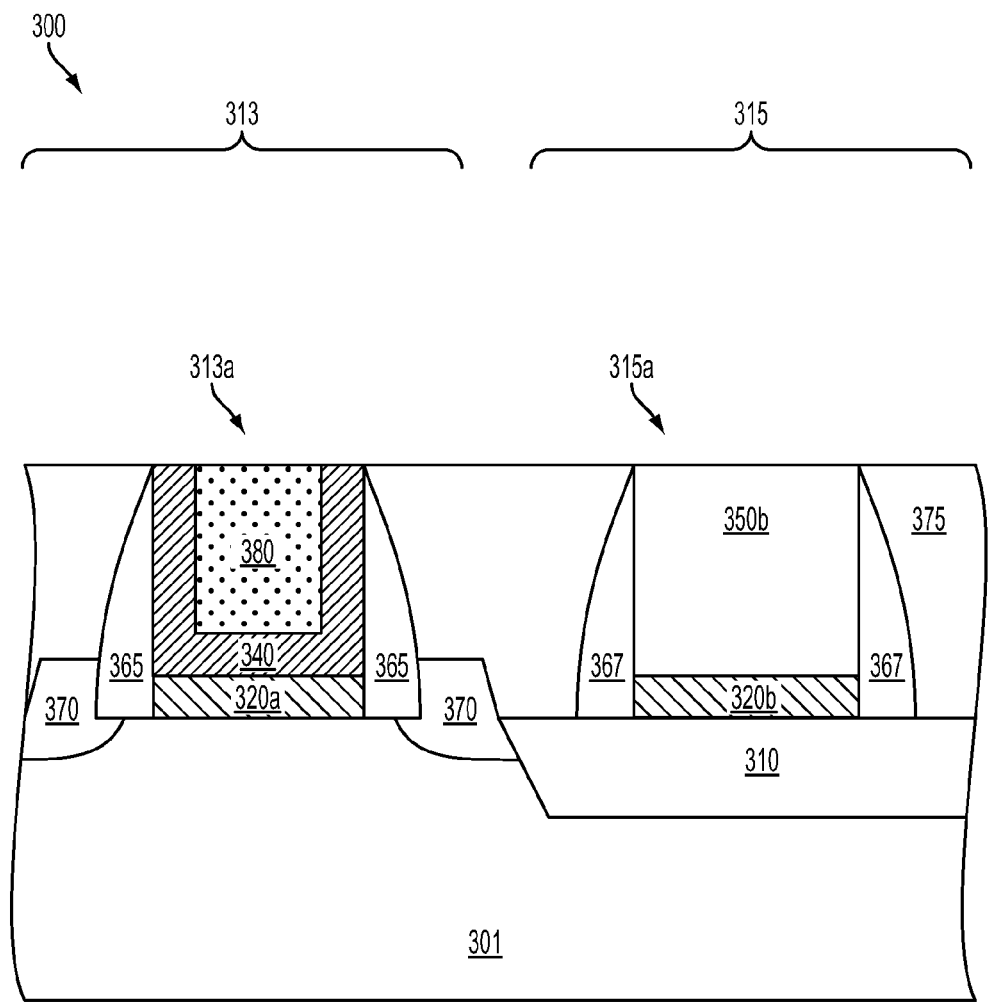

Referring to FIG. 3H, a conductive layer 380 can be formed in the opening 377 (shown in FIG. 3G). As shown, a transistor 313a and a resistor structure 315a can be formed over the substrate 301. In some embodiments, the conductive layer 380 can have a top surface that is substantially level with the top surface of the dielectric layer 375.

Referring again to FIG. 3H, the work-function metallic layer 340 can be disposed between the conductive layer 380 and the gate dielectric structure 320a. The work-function metallic layer 340 can continuously extend around the sidewalls and bottom of the conductive layer 380. The semiconductor layer 350b can directly contact the gate dielectric structure 320b.

As noted, the resistance of the resistor can be adjusted by in-situ and/or implantation doping of the semiconductor layer 350b. Because the semiconductor layer 350b has a substantive thickness, a minor thickness variation of the semiconductor layer 350b resulting from a deposition process does not substantially affect the thickness of the semiconductor layer 350b. The resistance variation of the semiconductor layer 350b resulting from the thickness variation can be reduced. A desired resistance precision of the semiconductor layer 350b can be achieved. In some embodiments, the process and/or structure described above in conjunction with FIG. 2L can be applied to the process and/or structure of FIGS. 3A-3H to desirably adjust the resistance of the resistors.

FIGS. 4A-4F are schematic cross-sectional views of an integrated circuit during various gate-first high-k metal-gate fabrication stages. It is understood that FIGS. 4A-4F have been simplified for a better understanding of the concepts of the present disclosure. Accordingly, it should be noted that additional processes may be provided before, during, and after FIGS. 4A-4F, and that some other processes may only be briefly described herein.

Figure 4A:
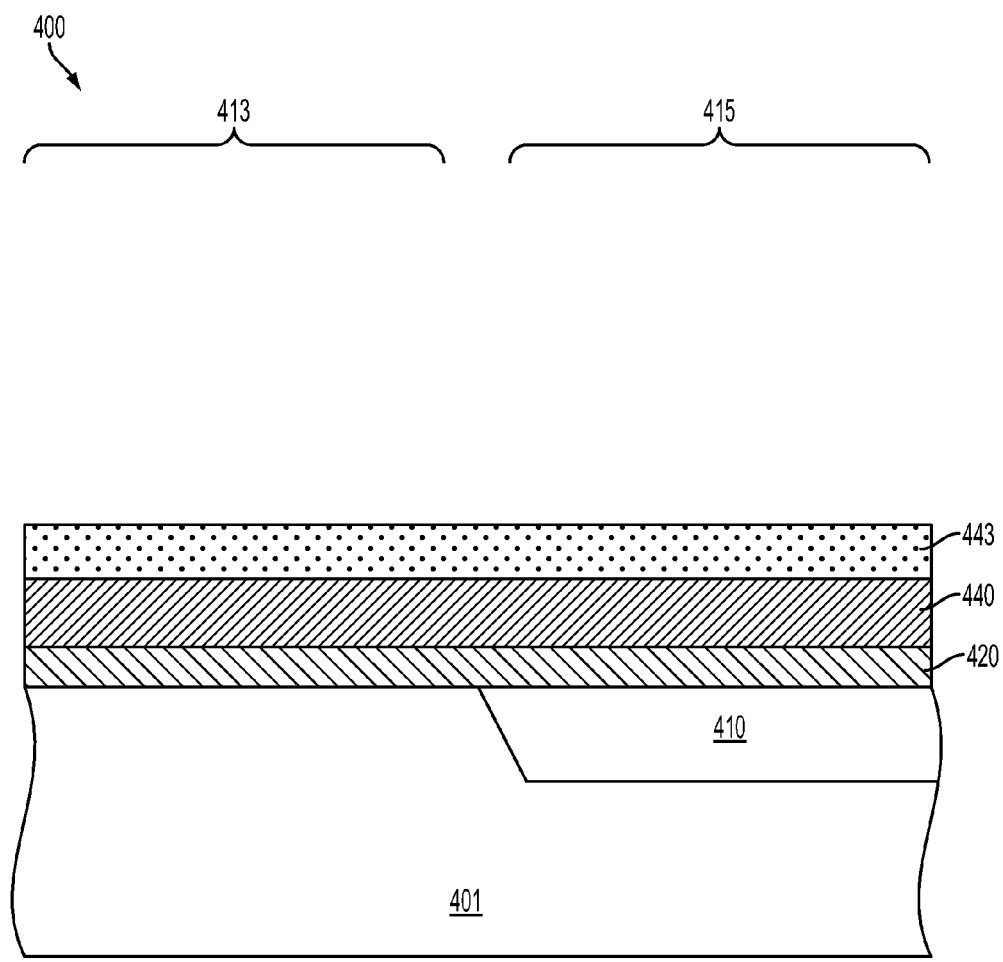

Referring now to FIGS. 4A-4F, an integrated circuit 400 can be fabricated over a substrate 401. Items of FIGS. 4A-4F that are the same or similar items in FIGS. 2A-2K are indicated by the same reference numerals, increased by 200. The integrated circuit 400 can include a transistor region 413 and a resistor region 415. In FIG. 4A, an isolation structure, e.g., a shallow trench isolation feature 410, can be formed in the substrate 401.

Referring again to FIG. 4A, a gate dielectric stack 420, a work-function metallic material 440 and a metallic layer 443 can be sequentially formed over the substrate 401. In some embodiments, the metallic layer 443 may be made of at least one material such as aluminum oxide, aluminum, aluminum nitride, titanium, titanium nitride (TiN), tantalum, tantalum nitride, other suitable material, and/or combinations thereof. In some embodiments, the metallic layer 443 can be referred to as a cap metallic layer.

Figure 4B:
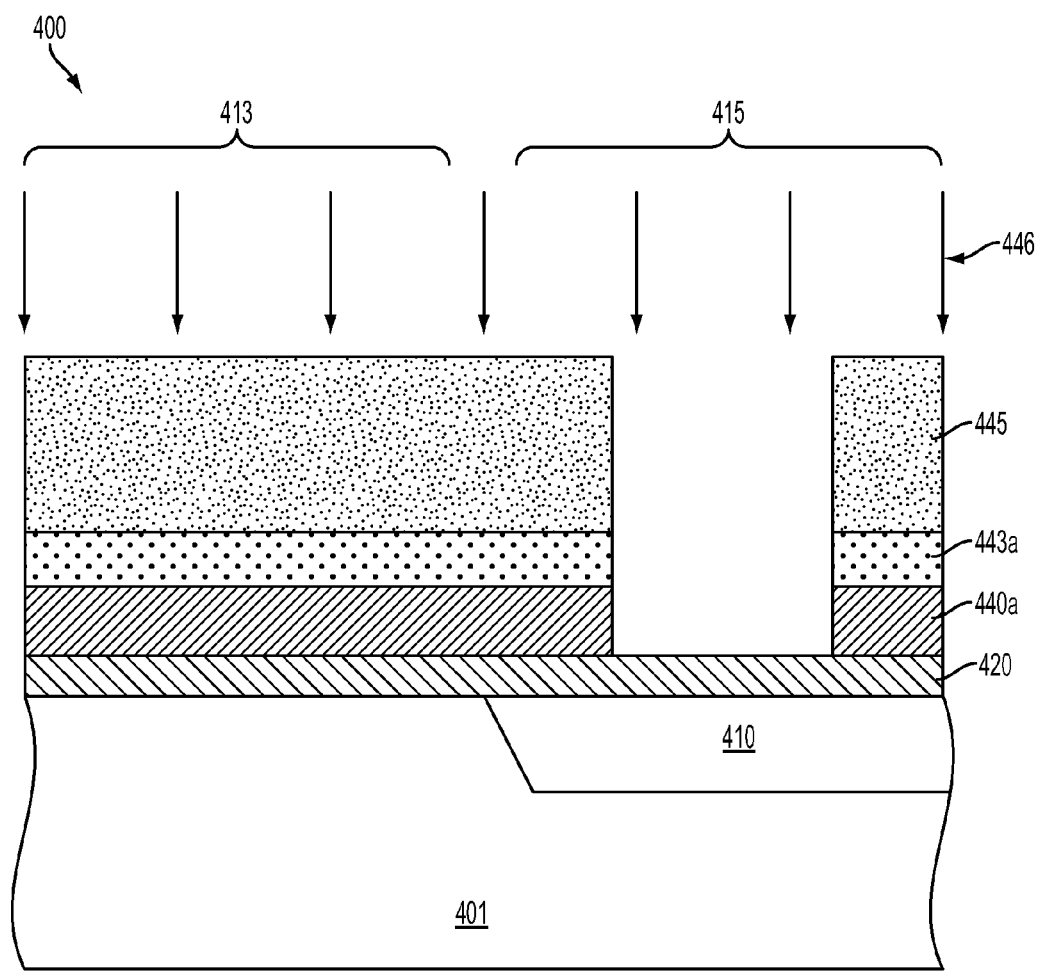
Figure 4C:
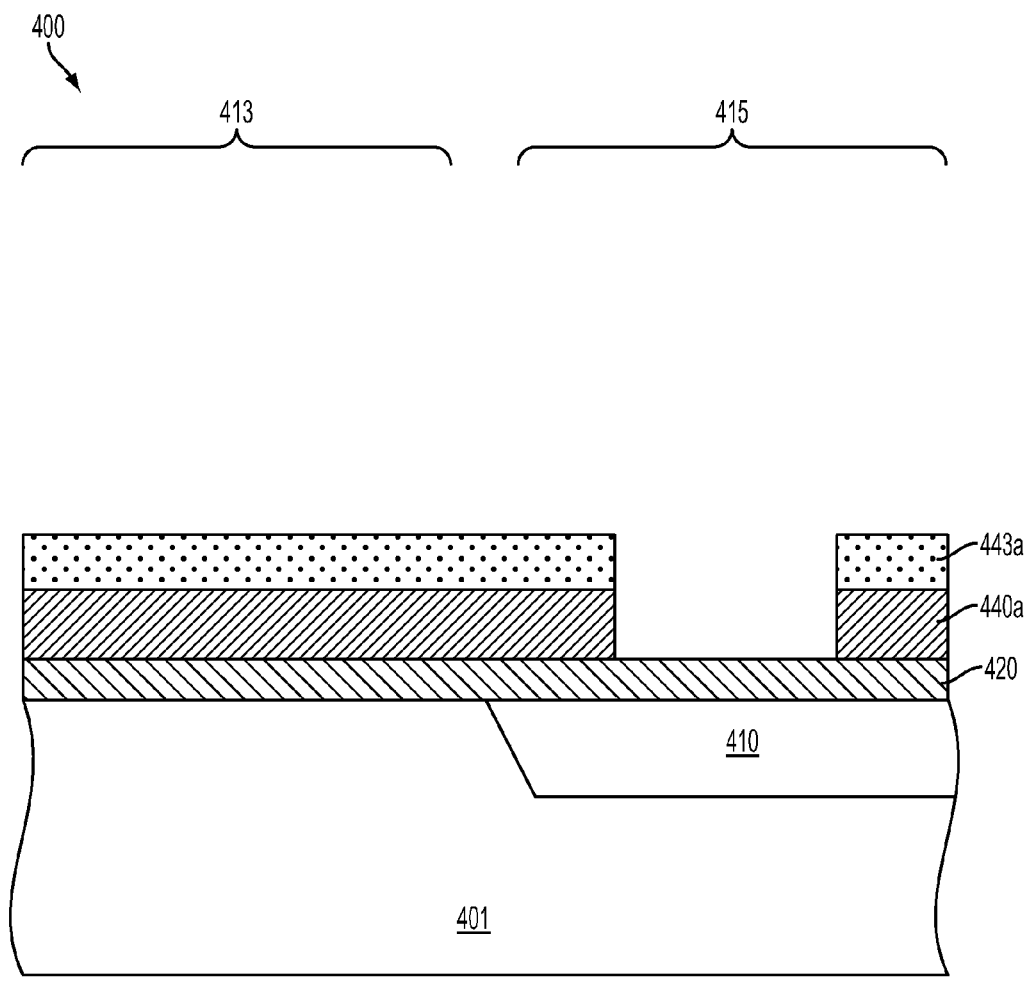

Referring to FIG. 4B, a mask layer 445 can be formed over the metallic layer 443. An etch process 446 uses the mask layer 445 to remove portions of the metallic layer 443 and the work-function metallic material 440, exposing a portion of the gate dielectric stack 420. The etch process 446 can include a dry etch process, a wet etch process, or any combinations thereof. After the mask layer 445 is removed, the remaining metallic layer 443a is exposed as shown in FIG. 4C. In some embodiments, the etch process 446 can also remove a portion of the gate dielectric stack 420, such that a portion of the substrate 401 is exposed.

Figure 4D:
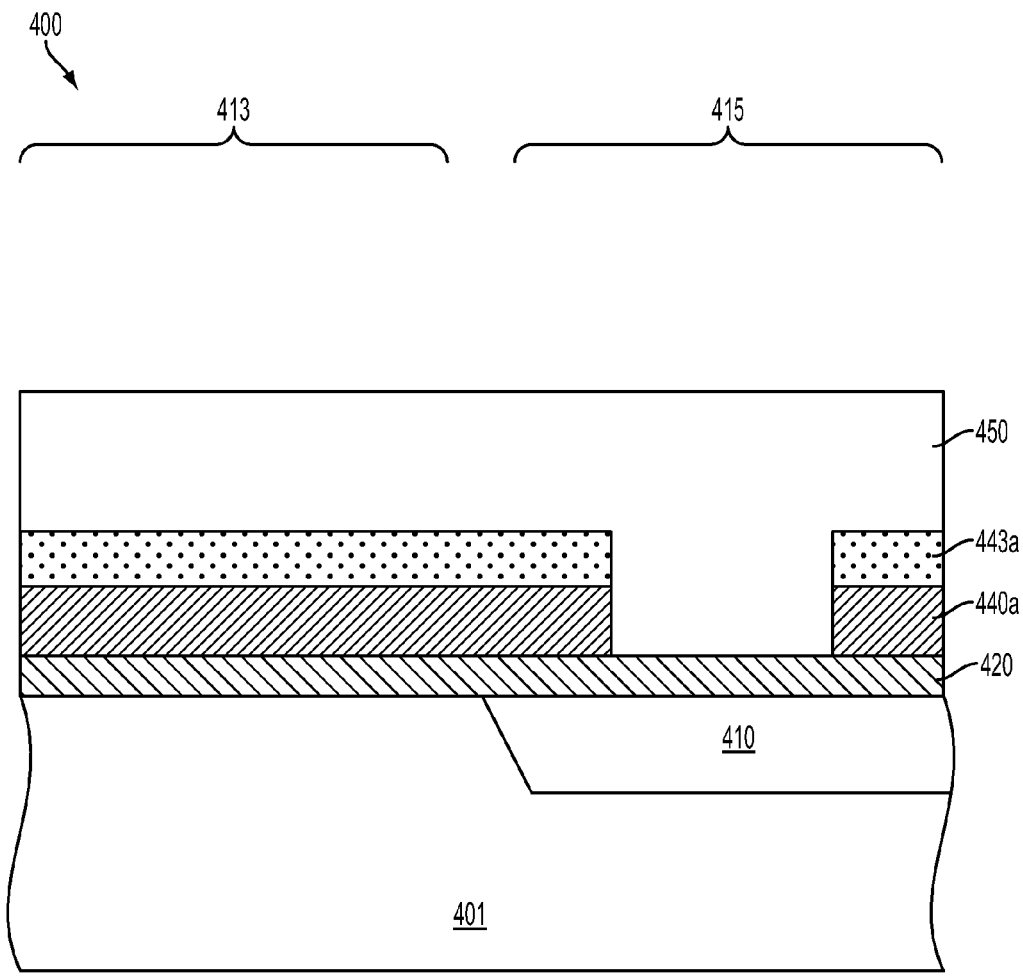

Referring to FIG. 4D, a semiconductor material 450 can be disposed over the remaining metallic layer 443a and the exposed gate dielectric stack 420. In some embodiments, the semiconductor material 450 can continuously extend from the transistor region 413 to the resistor region 415. In other embodiments, the semiconductor material 450 can be undoped or in-situ doped.

Figure 4E:
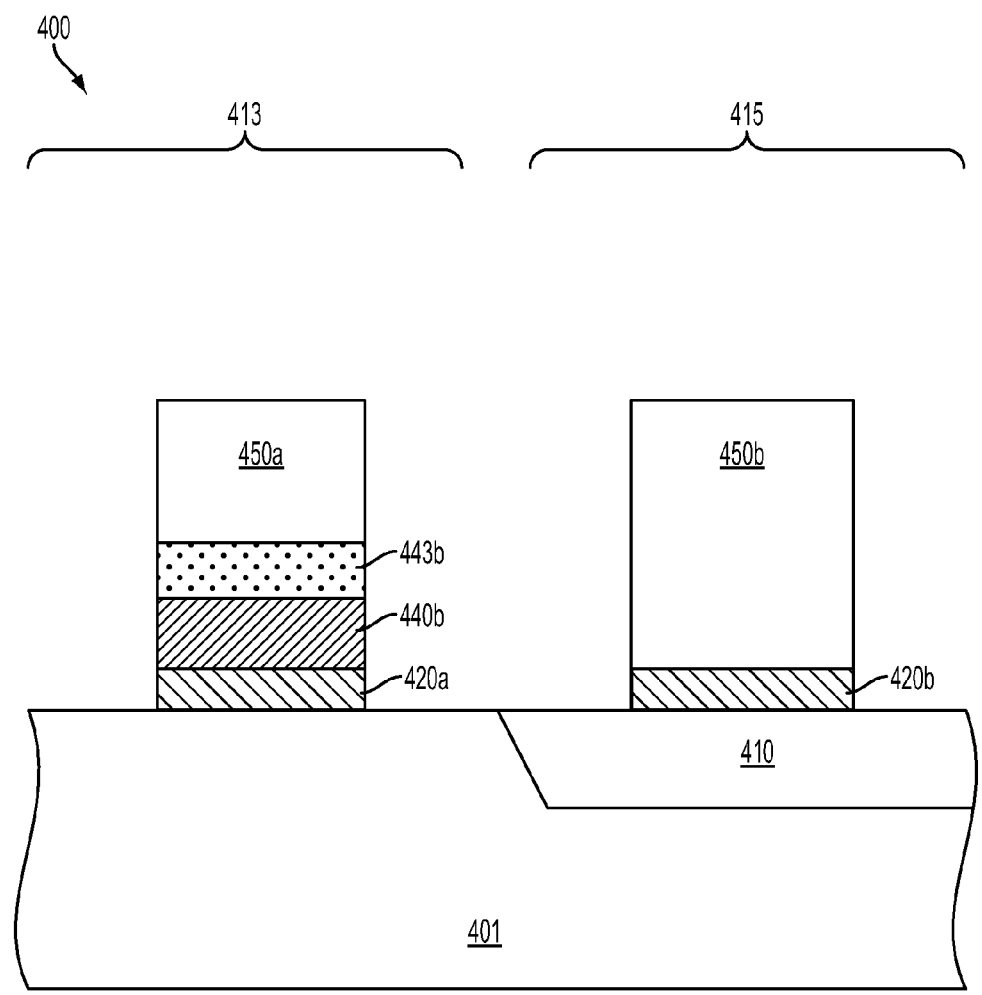

Referring to FIG. 4E, a patterning process can be performed to pattern the semiconductor material 450, the remaining metallic layer 443a, the remaining work-function metallic material 440a and the gate dielectric stack 420 (shown in FIG. 4D). By the patterning process, gate dielectric structures 420a and 420b can be formed over the substrate 401, which are disposed in the transistor region 413 and the resistor region 415, respectively. A work-function metallic layer 440b can be disposed over the gate dielectric structure 420a. A metallic layer 443b can be disposed over the work-function metallic layer 440b. A silicon layer 450a can be disposed over the metallic layer 443b. A silicon layer 450b can directly contact the gate dielectric structure 420b.

Figure 4F:
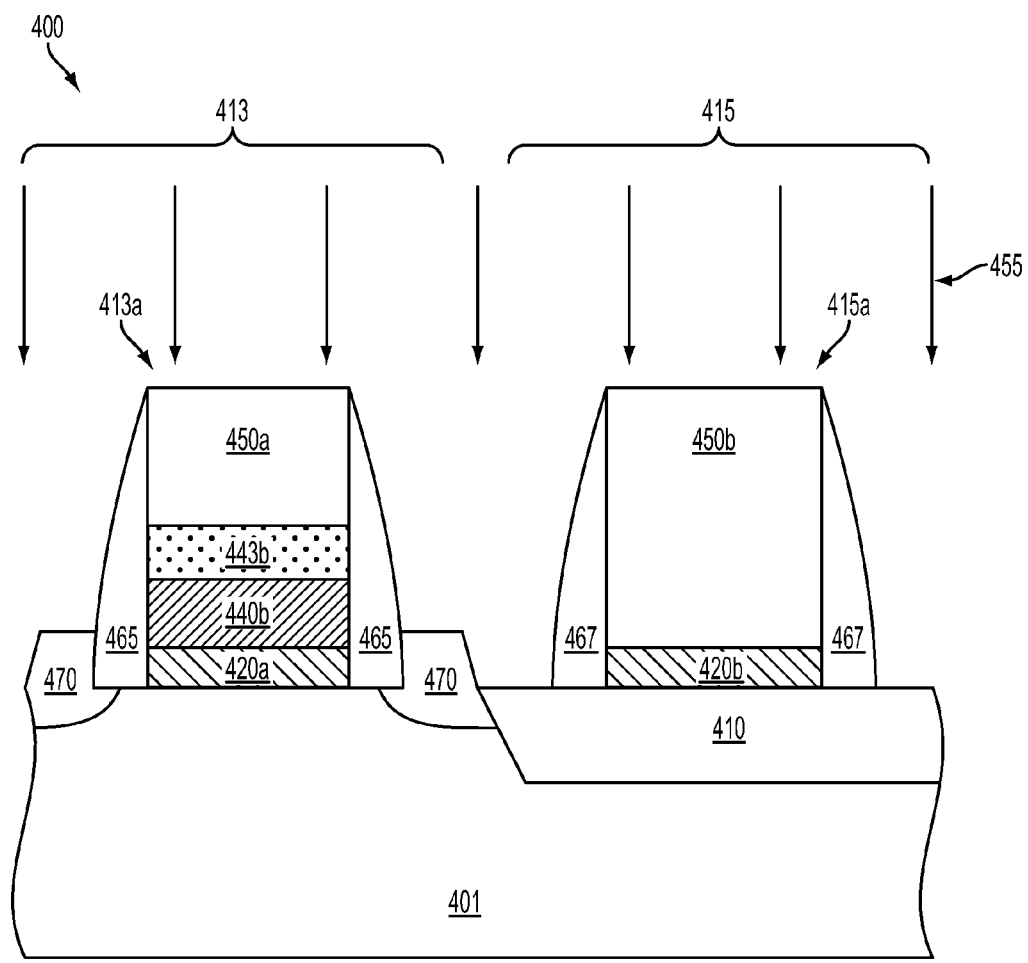

Referring to FIG. 4F, at least one implantation process 455 can be performed to implant dopants into the substrate 401 to form a source/drain (S/D) region 470 adjacent to each sidewall of the gate dielectric structure 420a. Spacers 465 and 467 can be disposed on sidewalls of the semiconductor layers 450a and 450b, respectively. It is noted that the process of forming the S/D regions 470 can optionally include the processes of forming the LDD regions, stressors and/or silicide regions described above in conjunction with FIG. 2H.

As noted, the resistance of the resistor can be adjusted by in-situ and/or implantation doping the semiconductor layer 450b. Because the semiconductor layer 450b has a substantive thickness, a minor thickness variation of the semiconductor layer 450b resulting from a deposition process does not substantially affect the thickness of the semiconductor layer 450b. The resistance variation of the semiconductor layer 450b resulting from the thickness variation can be reduced. A desired resistance precision of the semiconductor layer 450b can be achieved. In some embodiments, the process and/or structure described above in conjunction with FIG. 2L can be applied to the process and/or structure of FIGS. 4A-4F to desirably adjust the resistance of the resistors.

An aspect of this description is related to an integrated circuit. The integrated circuit comprises a transistor and a resistor. The transistor comprises a gate stack. The gate stack comprises a first dielectric layer, a first conductive layer over the first dielectric layer, a second conductive layer over the first conductive layer, and a second dielectric layer over the second conductive layer. The transistor also comprises source/drain (S/D) regions adjacent to the gate stack. The resistor is adjacent to the transistor, and comprises a third dielectric layer.

Another aspect of this description is related to an integrated circuit. The integrated circuit comprises a transistor and a resistor structure. The transistor comprises a gate dielectric structure over a substrate, and a first metal layer over the gate dielectric structure. The first metal layer has a recessed portion. The transistor also comprises a second metal layer within the recessed portion of the first metal layer, a source/drain (S/D) region adjacent to the gate dielectric structure, and a doped semiconductor layer over the second metal layer. The resistor structure comprises a semiconductor material over the substrate. A top surface of the doped semiconductor layer is substantially coplanar with a top surface of the semiconductor material.

A further aspect of this description is related to an integrated circuit. The integrated circuit comprises a transistor and a resistor structure. The transistor comprises a gate dielectric structure over a substrate, a metal layer over the gate dielectric structure, a conductive layer over the metal layer, and a first doped semiconductor layer over the conductive layer. The resistor structure comprises a second doped semiconductor layer over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a transistor comprising:
     a gate stack comprising:
       a first dielectric layer directly on a substrate;
       a first conductive layer directly on the first dielectric layer;
       a second conductive layer over the first conductive layer, wherein the first conductive layer continuously extends around sidewalls of the second conductive layer; and
     source/drain (S/D) regions adjacent to the gate stack; and
   a resistor adjacent to the transistor, the resistor comprising:
     a semiconductor layer comprising a substantially planar top surface; and
     first spacers adjoining and extending below sidewalls of the semiconductor layer, wherein the substantially planar top surface of the semiconductor layer is adjacent to each of the first spacers, and extends continuously between the first spacers.

2. The integrated circuit of claim 1, wherein an uppermost portion of the second conductive layer is substantially coplanar with a top portion of the first conductive layer.

3. The integrated circuit of claim 1, further comprising:
   an isolation structure beneath the resistor structure.

4. The integrated circuit of claim 1, wherein the second conductive layer comprises Al, Cu, Ti, TiN, TaN, Ta, TaC, TaSiN, W, WN, MoN, MoON, or $RuO_2$.

5. The integrated circuit of claim 1, further comprising:
   second spacers adjoining sidewalls of the gate stack.

6. The integrated circuit of claim 1, wherein the first dielectric layer comprises a high-k dielectric material.

7. The integrated circuit of claim 1, wherein
   the resistor further comprises a second dielectric layer under the semiconductor layer, and
   the semiconductor layer directly contacts the second dielectric layer.

8. The integrated circuit of claim 1, wherein the resistor is a first resistor, and the integrated circuit further comprises a second resistor adjacent to the first resistor.

9. The integrated circuit of claim 8, wherein the first resistor and the second resistor are positioned over a shallow trench isolation feature.

10. The integrated circuit of claim 1, wherein the resistor further comprises a silicide region.

11. An integrated circuit comprising:
    a transistor comprising:
      a first dielectric structure directly on a substrate;
      a first metal layer directly on the gate dielectric structure, the first metal layer having a recessed portion;
      a second metal layer within the recessed portion of the first metal layer;
      first spacers adjoining sidewalls of the first metal layer and the first dielectric structure: and
      a source/drain (S/D) region adjacent to the first dielectric structure; and
    a resistor structure comprising:
      second spacers:
      a semiconductor material over the substrate, the semiconductor material comprising a substantially planar top surface that is adjacent to each of the spacers and extends continuously between the spacers; and
      a second dielectric structure between the second spacers and between the semiconductor material and the substrate,
    wherein a top surface of the second metal layer is substantially coplanar with the top surface of the semiconductor material.

12. The integrated circuit of claim 11, further comprising:
    a silicide over the S/D region.

13. The integrated circuit of claim 11, wherein the first metal layer comprises an N-type work-function material or a P-type work-function material.

14. The integrated circuit of claim 11, further comprising a silicide region on the semiconductor material.

15. The integrated circuit of claim 11, wherein the second dielectric structure is positioned above an isolation structure.

16. The integrated circuit of claim 11, further comprising a dielectric layer between the transistor and the resistor structure, wherein a top surface of the dielectric layer is substantially coplanar with the top surface of the semiconductor material.

17. An integrated circuit comprising:
    a transistor comprising:
      a gate stack comprising:
        a first dielectric layer directly on a substrate;
        a first conductive layer directly on the first dielectric layer; and
        a second conductive layer over the first conductive layer, wherein the first conductive layer continuously extends around sidewalls of the second conductive layer; and source/drain (S/D) regions adjacent to the gate stack;
a first resistor adjacent to the transistor, the first resistor comprising:
first spacers;
a second dielectric layer between the first spacers; and
a first semiconductor layer over the second dielectric layer, wherein the first semiconductor layer comprises a substantially planar top surface that is adjacent to each of the first spacers and extends continuously between the first spacers; and
a second resistor adjacent to first resistor, the second resistor comprising:
second spacers;
a third dielectric layer between the second spacers; and
a second semiconductor layer over the third dielectric layer, wherein the second semiconductor layer comprises a substantially planar top surface that is adjacent to each of the second spacers and extends continuously between the second spacers.

18. The integrated circuit of claim 17, wherein the first resistor and the second resistor are positioned over a shallow trench isolation feature.

19. The integrated circuit of claim 17, wherein at least one of the first resistor or the second resistor comprises a silicide region.

20. The integrated circuit of claim 17, wherein at least one of
the first semiconductor layer directly contacts the second dielectric layer, or
the second semiconductor layer directly contacts the third dielectric layer.

* * * * *